(12) United States Patent
Tosaki et al.

(10) Patent No.: US 12,064,949 B2
(45) Date of Patent: Aug. 20, 2024

(54) CONDUCTIVE COMPOSITION FOR MOLDED FILM, MOLDED FILM, MOLDED ARTICLE, AND METHOD FOR PRODUCTION THEREOF

(71) Applicants: artience Co., Ltd., Tokyo (JP); TOYO INK CO., LTD., Tokyo (JP)

(72) Inventors: Kouichi Tosaki, Tokyo (JP); Atsushi Nakazato, Tokyo (JP)

(73) Assignees: artience Co., Ltd., Tokyo (JP); TOYO INK CO., LTD., Tokyo (JP)

( * ) Notice: Subject to any disclaimer, the term of this patent is extended or adjusted under 35 U.S.C. 154(b) by 115 days.

(21) Appl. No.: 17/040,045

(22) PCT Filed: Apr. 12, 2019

(86) PCT No.: PCT/JP2019/016000
§ 371 (c)(1),
(2) Date: Sep. 21, 2020

(87) PCT Pub. No.: WO2019/203159
PCT Pub. Date: Oct. 24, 2019

(65) Prior Publication Data

US 2021/0016541 A1    Jan. 21, 2021

(30) Foreign Application Priority Data

Apr. 19, 2018 (JP) ................. 2018-080514

(51) Int. Cl.
*B32B 7/025* (2019.01)
*B29C 45/16* (2006.01)
(Continued)

(52) U.S. Cl.
CPC .......... *B32B 7/025* (2019.01); *B29C 45/1679* (2013.01); *B32B 27/08* (2013.01);
(Continued)

(58) Field of Classification Search
CPC ............ C08G 18/4211; C08G 18/4213; C08G 18/755; C08G 18/792; C08G 18/807;
(Continued)

(56) References Cited

U.S. PATENT DOCUMENTS

2009/0022957 A1    1/2009 Aso et al.
2009/0258241 A1    10/2009 Shiraishi et al.
(Continued)

FOREIGN PATENT DOCUMENTS

JP            S6428998        1/1989
JP       2002298648 A    * 10/2002
(Continued)

OTHER PUBLICATIONS

Baxenden Chemicals Limited, "Trixene Blocked Isocyanates", with English Translation, pp. 1-4, which is sited in "Office Action for Revocation of priority Japan Patent Application No. 2018-080514", issued on Feb. 10, 2020.
(Continued)

*Primary Examiner* — Tri V Nguyen
(74) *Attorney, Agent, or Firm* — JCIPRNET

(57) ABSTRACT

Provided is a conductive composition for molded film that enables production of a molded film for which tensile force-induced reductions in conductivity are suppressed. The conductive composition for molded film contains a resin (A), conductive fine particles (B), and a solvent (C), wherein the solvent (C) contains, in 100 parts by mass of the solvent (C), at least 40 parts by mass of a solvent (C') that satisfies the following condition (1) and condition (2). (1) A boiling point of 180° C. to 270° C. (2) At least one of the following is satisfied: the polar parameter $\delta p$ of the Hansen solubility parameter (HSP) is $0 \leq \delta p \leq 5.0$, and the hydrogen-bond parameter $\delta h$ of the Hansen solubility parameter (HSP) is $9.8 \leq \delta h \leq 4.0$.

12 Claims, 6 Drawing Sheets

(51) Int. Cl.
| | |
|---|---|
| B32B 27/08 | (2006.01) |
| B32B 27/18 | (2006.01) |
| C08J 5/12 | (2006.01) |
| C08J 5/18 | (2006.01) |
| C08K 3/04 | (2006.01) |
| C08K 3/08 | (2006.01) |
| C08K 3/22 | (2006.01) |
| C08K 9/02 | (2006.01) |
| C09D 11/033 | (2014.01) |
| C09D 11/037 | (2014.01) |
| C09D 11/102 | (2014.01) |
| C09D 11/104 | (2014.01) |
| C09D 11/107 | (2014.01) |
| C09D 11/52 | (2014.01) |
| H01B 1/22 | (2006.01) |
| H05K 3/10 | (2006.01) |
| B29K 669/00 | (2006.01) |

(52) U.S. Cl.
CPC .............. *B32B 27/18* (2013.01); *C08J 5/121* (2013.01); *C08J 5/18* (2013.01); *C08K 3/04* (2013.01); *C08K 3/08* (2013.01); *C08K 3/22* (2013.01); *C08K 9/02* (2013.01); *C09D 11/033* (2013.01); *C09D 11/037* (2013.01); *C09D 11/102* (2013.01); *C09D 11/104* (2013.01); *C09D 11/107* (2013.01); *C09D 11/52* (2013.01); *H01B 1/22* (2013.01); *H05K 3/103* (2013.01); *B29K 2669/00* (2013.01); *B32B 2264/102* (2013.01); *B32B 2264/1051* (2020.08); *B32B 2264/1055* (2020.08); *C08J 2333/00* (2013.01); *C08J 2363/00* (2013.01); *C08J 2367/02* (2013.01); *C08J 2375/06* (2013.01); *C08K 2003/0806* (2013.01); *C08K 2003/085* (2013.01); *C08K 2003/2231* (2013.01); *C08K 2201/001* (2013.01)

(58) Field of Classification Search
CPC . C08G 18/0823; B32B 27/281; B32B 27/308; B32B 27/32; B32B 27/34; B32B 27/36; B32B 27/38; B32B 27/40; B32B 27/285; B32B 27/304; B32B 27/365; B32B 2255/10; B32B 2255/26; B32B 2264/102; B32B 2264/1051; B32B 2264/1055; C08J 2333/00; C08J 2363/00; C08J 2367/02; C08J 2375/06; C08J 5/121; C08J 5/18; C09D 175/06; C09D 11/102; C09D 11/104; C09D 11/107; C09D 11/037; H01B 5/14; H01B 1/22; B29C 45/1679

USPC ......................................................... 428/21
See application file for complete search history.

(56) References Cited

U.S. PATENT DOCUMENTS

| | | | |
|---|---|---|---|
| 2014/0374672 | A1 | 12/2014 | Chopra et al. |
| 2017/0298242 | A1 | 10/2017 | Mostowy-Gallagher et al. |
| 2018/0072923 | A1* | 3/2018 | Matsuura .................. C09J 5/06 |
| 2018/0230287 | A1* | 8/2018 | Shiozawa ............. H05K 1/092 |
| 2018/0273779 | A1 | 9/2018 | Niwayama et al. |

FOREIGN PATENT DOCUMENTS

| | | | | |
|---|---|---|---|---|
| JP | 2007296848 | | 11/2007 | |
| JP | 2009117072 | A * | 5/2009 | |
| JP | 2011057859 | | 3/2011 | |
| JP | 2011252140 | | 12/2011 | |
| JP | 2012011691 | | 1/2012 | |
| JP | 2012150920 | | 8/2012 | |
| JP | 2015007230 | | 1/2015 | |
| JP | 2015129234 | | 7/2015 | |
| JP | 2015172103 | | 10/2015 | |
| JP | 2015193709 | | 11/2015 | |
| JP | 6110579 | | 4/2017 | |
| JP | 2017538247 | | 12/2017 | |
| JP | 2018041692 | | 3/2018 | |
| JP | 2018045872 | | 3/2018 | |
| KR | 20160111944 | A * | 9/2016 | |
| WO | 2007126012 | | 11/2007 | |
| WO | 2016060838 | | 4/2016 | |
| WO | WO-2017023747 | A1 * | 2/2017 | .............. C08J 5/18 |
| WO | WO-2017026420 | A1 * | 2/2017 | .............. C08K 3/08 |
| WO | 2017163615 | | 9/2017 | |
| WO | WO-2019039209 | A1 * | 2/2019 | .............. C08K 3/04 |

OTHER PUBLICATIONS

"Office Action of priority Japan Patent Application No. 2018-080514", issued on Oct. 23, 2018, with English translation thereof, pp. 1-16.
"Office Action of priority Japan Patent Application No. 2018-080514", issued on Jan. 22, 2019, with English translation thereof, pp. 1-8.
"Office Action for Revocation of priority Japan Patent Application No. 2018-080514", issued on Feb. 10, 2020, with English translation thereof, pp. 1-36.
"International Search Report (Form PCT/ISA/210) of PCT/JP2019/016000," mailed on Jul. 2, 2019, with English translation thereof, pp. 1-4.
"Search Report of Europe Counterpart Application", issued on Dec. 16, 2021, p. 1-p. 9.

* cited by examiner

CONDUCTIVE COMPOSITION FOR MOLDED FILM, MOLDED FILM, MOLDED ARTICLE, AND METHOD FOR PRODUCTION THEREOF

CROSS-REFERENCE TO RELATED APPLICATION

This application is a 371 application of the International PCT application serial no. PCT/JP2019/016000, filed on Apr. 12, 2019, which claims the priority benefits of Japan Patent Application No. 2018-080514, filed on Apr. 19, 2018. The entirety of each of the above-mentioned patent applications is hereby incorporated by reference herein and made a part of this specification.

BACKGROUND

Technical Field

The invention relates to a conductive composition for molded film, a molded film, a molded article, and a method for production thereof.

Description of Related Art

Patent Document 1 discloses a specific conductive circuit integrated molded product that has a resin molded article, a base film embedded to be flush with one surface of the resin molded article, and a conductive circuit arranged between the resin molded article and the base film. Patent Document 1 describes that the base film formed with the specific conductive circuit is arranged on a cavity surface of a mold for injection molding, and then a molten resin is injected to injection-mold the resin molded article, as a method for producing the conductive circuit integrated molded product. In Patent Document 1, the conductive circuit is formed by etching a specific transparent metal thin film.

A printing method using a conductive ink has been studied to be used as a conductive circuit forming method that replaces the etching method. Compared with the etching method, the method of printing a conductive ink can easily form a conductive circuit without complicated processes, and can improve the productivity and reduce the cost. For example, Patent Document 2 discloses a specific conductive ink that contains specific conductive fine particles and a specific epoxy resin, as a low temperature treatment type conductive ink capable of forming a high-definition conductive pattern by screen printing. With screen printing, it is possible to increase the thickness of the conductive pattern and to reduce the resistance of the conductive pattern. In the embodiment of Patent Document 2, diethylene glycol monoethyl ether acetate is used as a solvent of the conductive ink.

Furthermore, Patent Document 3 discloses a method of thermocompression bonding a laminate having a printed layer printed in a pattern on a transparent resin layer, and a laminate sheet having a decorative layer on a base film so as to form the decorative layer into an uneven shape along the pattern of the printed layer, as a method for producing a decorative sheet capable of expressing a three-dimensional effect.

RELATED ART

Patent Document

[Patent Document 1] Japanese Laid-Open No. 2012-11691
[Patent Document 2] Japanese Laid-Open No. 2011-252140
[Patent Document 3] Japanese Laid-Open No. 2007-296848

SUMMARY

Problems to be Solved

According to the method of Patent Document 1, a conductor can be easily provided on the surface of the molded article. Meanwhile, there is an increasing demand for forming a conductive circuit on base material surfaces that have various shapes such as a base material having an uneven surface or a curved surface. When a film having a conductive layer is attached to such a base material surface to form a conductive circuit, the film needs to be deformed to fit the surface shape of the base material. When the film is deformed, a large tensile force may be generated partially in the conductive layer. The tensile force causes breakage of the conductive layer and results in reduction in conductivity.

The invention has been made in view of such circumstances, and is to provide a conductive composition for molded film capable of producing a molded film for which tensile force-induced reduction in conductivity is suppressed, a molded film for which tensile force-induced reduction in conductivity is suppressed, a molded article having excellent conductivity, and a method for production thereof

Means for Solving the Problems

A conductive composition for molded film according to the present embodiment includes: a resin (A), conductive fine particles (B), and a solvent (C). The solvent (C) includes, in 100 parts by mass of the solvent (C), 40 parts by mass or more of a solvent (C') that satisfies the following condition (1) and at least one of conditions (2-1) and (2-2):
(1) a boiling point is 180° C. or higher and 270° C. or lower
(2-1) a polar parameter $\delta p$ of a Hansen solubility parameter (HSP) is $0 \leq \delta p \leq 5.0$
(2-2) a hydrogen-bond parameter $\delta h$ of the Hansen solubility parameter (HSP) is $9.8 \leq \delta h \leq 24.0$.

According to an embodiment of the conductive composition for molded film of the present embodiment, the solvent (C') further satisfies the following condition (2-3):
(2-3) a dispersion parameter $\delta d$ of the Hansen solubility parameter (HSP) is $14.0 \leq \delta d \leq 20.0$.

According to an embodiment of the conductive composition for molded film of the present embodiment, the conductive fine particles (B) include one or more types of conductive fine particles selected from silver powder, copper powder, silver-coated powder, copper alloy powder, conductive oxide powder, and carbon fine particles.

According to an embodiment of the conductive composition for molded film of the present embodiment, the resin (A) includes one or more types of substituents selected from a hydroxy group, an amino group, a carboxyl group, and an acid anhydride group.

According to an embodiment of the conductive composition for molded film of the present embodiment, the resin (A) includes two or more one or more types of reactive functional groups selected from a hydroxy group, an amino group, a carboxyl group, and an acid anhydride group in a molecule, and the conductive composition for molded film further includes a crosslinking agent (D) having two or more reactive functional groups capable of forming a crosslink with the reactive functional group of the resin (A) in one molecule.

According to an embodiment of the conductive composition for molded film of the present embodiment, a weight average molecular weight of the resin (A) is 20,000 or more and 600,000 or less, and a ratio between a total amount $F_D$ (mol) of a substance amount of a second reactive functional group of the crosslinking agent (D) and a mass $M_A$ (g) of the resin (A) satisfies the following formula (1):

$$5.0 \times 10^{-5} \leq F_D/M_A \leq 6.0 \times 10^{-4}. \quad \text{formula (1)}$$

A molded film according to the present embodiment includes a conductive layer on a base film, and the conductive layer is a cured product of the conductive composition for molded film of the present embodiment.

According to an embodiment of the molded film of the present embodiment, a relationship between breaking elongation rates of respective layers at a softening point temperature of the base film satisfies:

breaking elongation rate of the base film>breaking elongation rate of the conductive layer.

A molded film according to the present embodiment includes a decorative layer and a conductive layer on a base film, and the conductive layer is a cured product of the conductive composition for molded film of the present embodiment.

According to an embodiment of the molded film of the present embodiment, a relationship between breaking elongation rates of respective layers at a softening point temperature of the base film satisfies:

breaking elongation rate of the base film>breaking elongation rate of the decorative layer>breaking elongation rate of the conductive layer.

According to an embodiment of the molded film of the present embodiment, the base film is a film selected from polycarbonate, polymethylmethacrylate, and polyethylene terephthalate, or a laminated film of polycarbonate, polymethylmethacrylate, and polyethylene terephthalate.

A molded article according to the present embodiment includes a conductive layer laminated on a base material, and the conductive layer is a cured product of the conductive composition for molded film.

A first production method of a molded article according to the present embodiment includes: producing a molded film by printing and drying the conductive composition for molded film of the present embodiment on a base film; arranging the molded film on a base material; and integrating the molded film and the base material by an overlay molding method.

A second production method of a molded article according to the present embodiment includes: producing a molded film by printing and drying the conductive composition for molded film of the present embodiment on a base film; molding the molded film into a predetermined shape; arranging the molded film that has been molded in a mold for injection molding; and molding a base material by injection molding, and integrating the molded film and the base material.

A third production method of a molded article according to the present embodiment includes: producing a molded film by printing and drying the conductive composition for molded film of the present embodiment on a base film; arranging the molded film in a mold for injection molding; and molding a base material by injection molding, and transferring a conductive layer in the molded film to a base material side.

Effects

According to the invention, a conductive composition for molded film capable of producing a molded film for which tensile force-induced reduction in conductivity is suppressed, a molded film for which tensile force-induced reduction in conductivity is suppressed, a molded article having excellent conductivity, and a method for production thereof can be provided.

DESCRIPTION OF THE EMBODIMENTS

Figure 1:
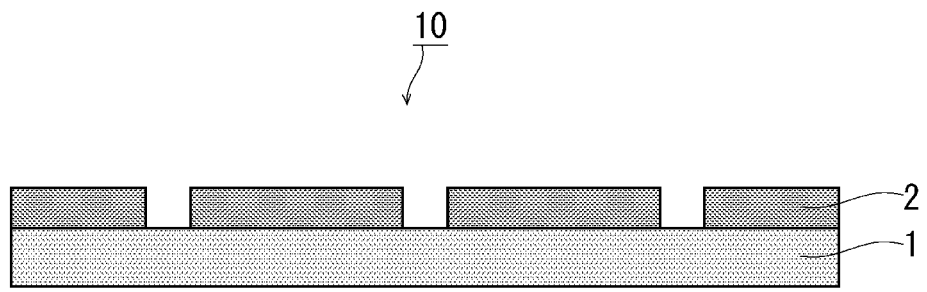
FIG. 1 is a schematic cross-sectional view showing an example of the molded film of the present embodiment.

Hereinafter, a conductive composition for molded film, a molded film, a molded article, and a method for production thereof according to the present embodiment will be described in detail in order. In the present embodiment, the cured product includes not only a product cured by a chemical reaction but also a product cured without a chemical reaction such as a product hardened by evaporating a solvent, for example.

[Conductive Composition for Molded Film]

The conductive composition for molded film of the present embodiment contains a resin (A), conductive fine particles (B), and a solvent (C), wherein the solvent (C) contains, in 100 parts by mass of the solvent (C), 40 parts by mass or more of a solvent (C') that satisfies the following condition (1) and at least one of conditions (2-1) and (2-2).

(1) The boiling point is 180° C. or higher and 270° C. or lower.

(2-1) The polar parameter δp of the Hansen solubility parameter (HSP) is 0≤δp≤5.0.

(2-2) The hydrogen-bond parameter δh of the Hansen solubility parameter (HSP) is 9.8≤δh≤24.0.

With the conductive composition for molded film of the present embodiment, it is possible to produce a molded film for which tensile force-induced reduction in conductivity is suppressed.

The inventors studied a screen-printable conductive composition in order to produce a molded film applicable to an uneven base material surface. When a solvent having a boiling point of 180° C. or higher and 270° C. or lower was selected and examined for application to screen printing, it was found that the magnitude of change in resistance value that occurs when the obtained molded film is pulled differs depending on the type of solvent contained in the conductive composition. The inventors conducted a study based on such findings, and the result was clear that when a conductive composition containing a specific solvent was printed on a resin film and dried by heating, the solvent permeated into the resin film at the contact surface between the conductive composition and the resin film, causing a slight dissolution or shrinkage of the resin film. It is presumed that such solvent permeation, dissolution or shrinkage occurs on the entire contact surface between the resin film and the conductive layer. This situation also occurs when the conductive layer is provided on a decorative layer. Therefore, it is expected that the adhesiveness between the resin film and the conductive layer slightly decreases, and the cohesive force of the conductive layer is also reduced due to the transfer of the solvent that has permeated into the resin film to the conductive layer during or after drying. Even if the molded film for forming the conductive layer has a resin film having such solvent permeation, dissolution or shrinkage, there is no problem when it is used alone as a flat film circuit board or the like. However, when it is used as a molded film that follows and is integrated with the shape of an uneven base material surface, the molded film involves deformation. At the time of the deformation, the molded film is subject to friction or tensile force with the molding mold. If the molded film has a resin film that has solvent permeation, dissolution or shrinkage, it is presumed that, at the time of the deformation, the conductive layer may be detached due to the friction or reduction in cohesive force, and the conductive layer may be disconnected with respect to stretching, which reduces the conductivity. As a result of earnest studies based on these findings, the inventors found that a solvent, which has a polar parameter δp of the Hansen solubility parameter (HSP) that exceeds 5.0 and a hydrogen-bond parameter δh of the Hansen solubility parameter that is less than 9.8, easily permeates into the base material film. That is, the inventors found that by using a solvent, which has a polar parameter δp of the Hansen solubility parameter (HSP) that is 0≤δp≤5.0, or has a hydrogen-bond parameter δh of the Hansen solubility parameter (HSP) that is 9.8≤δh≤24.0, the permeation into the base material film can be suppressed, and thus completed the invention. The conductive composition for molded film of the invention uses the above-mentioned specific solvent (C') and thereby makes it easy to produce a molded film that has a thick conductive layer having excellent conductivity by screen printing, etc. In addition, the molded film produced using the conductive composition for molded film suppresses reduction in conductivity even when used on an uneven base material surface. Furthermore, by using the molded film, it is possible to obtain a molded article with a conductive circuit formed on any surface such as an uneven surface or a curved surface.

The conductive composition for molded film of the present embodiment contains at least the resin (A), the conductive fine particles (B), and the solvent (C), and may further contain other components as necessary. Hereinafter, each component of such a conductive composition for molded film will be described.

<Resin (A)>

The conductive composition of the present embodiment contains the resin (A) having binder properties in order to impart film forming properties and adhesiveness to the base film or the decorative layer. Further, in the present embodiment, by containing the resin (A), flexibility can be imparted to the conductive layer. Therefore, by containing the resin (A), disconnection of the conductive layer with respect to stretching is suppressed.

The resin (A) can be appropriately selected from the resins used for applications of the conductive composition to be used. Examples of the resin (A) include acrylic resin, vinyl ether resin, polyether resin, polyester resin, polyurethane resin, epoxy resin, phenoxy resin, polycarbonate resin, polyvinyl chloride resin, polyolefin resin, styrene block copolymer resin, polyamide resin, polyimide resin, etc., which can be used alone or in combination of two or more.

In the present embodiment, the resin (A) preferably has a substituent selected from a hydroxy group, an amino group, a carboxyl group, and an acid anhydride group, among others. By having the substituent, the affinity with the conductive fine particles (B) described later is improved, and the adhesiveness to the base film, etc. is also improved. Further, in the present embodiment, the resin (A) preferably has two or more substituents selected from a hydroxy group, an amino group, a carboxyl group, and an acid anhydride group in one molecule. In this case, the resin (A) can be three-dimensionally crosslinked by combining with a crosslinking agent (D) described later, and can be suitably used in applications where hardness is required for the conductive layer.

When the resin (A) has a functional group selected from a hydroxy group, an amino group, a carboxyl group, and an acid anhydride group, the functional group value is preferably 1 mgKOH/g or more and 400 mgKOH/g or less, and more preferably 2 mgKOH/g or more and 350 mgKOH/g or less. Details of the method for calculating the functional group value will be described in the embodiment below. When the resin (A) has multiple types of functional groups, the functional group value is the total thereof. For example, when the resin (A) has a hydroxy group and a carboxyl group, the functional group value represents the total of the hydroxyl value and the acid value of the resin (A).

The weight average molecular weight of the resin (A) is not particularly limited, and is preferably 5,000 or more and 1,000,000 or less, more preferably 10,000 or more and 800,000 or less, and even more preferably 20,000 or more and 600,000 or less from the viewpoint of handleability when a coating film is formed. In the present embodiment, the weight average molecular weight is a polystyrene equivalent molecular weight measured using GPC (gel permeation chromatography) "HLC-8320" manufactured by Tosoh Corporation.

The glass transition temperature (Tg) of the resin (A) is not particularly limited, and the glass transition temperature (Tg) of the resin (A) is preferably 0° C. or higher and 150° C. or lower, and more preferably 5° C. or higher and 120° C. or lower from the viewpoint of easy handling of the conductive layer.

In the present embodiment, the resin (A) may be synthesized according to the embodiment described below or other known methods to be used, or a commercially available product having desired physical properties may be used. In the present embodiment, the resin (A) can be used alone or in combination of two or more.

The content ratio of the resin (A) in the conductive composition of the present embodiment is not particularly limited if it is appropriately adjusted according to the applications, and is preferably 5% by mass or more and 50% by mass or less, and more preferably 8% by mass or more and 40% by mass or less, based on the total solid content contained in the conductive composition. If the content ratio of the resin (A) is the above-described lower limit value or more, the film forming properties and the adhesiveness to the base film can be improved, and flexibility can be imparted to the conductive layer. Further, if the content ratio of the resin (A) is the above-described upper limit value or less, the content ratio of the conductive fine particles (B) can be relatively increased, and the conductive layer having excellent conductivity can be formed.

<Conductive Fine Particle (B)>

The conductive fine particles (B) are a plurality of conductive fine particles that come into contact with each other in the conductive layer to develop conductivity, and in the present embodiment, the conductive fine particles (B) are appropriately selected from those, which can obtain conductivity without being heated at a high temperature, to be used. Examples of the conductive fine particles used in the present embodiment include metal fine particles, carbon fine particles, conductive oxide fine particles, etc. Examples of the metal fine particles include not only simple metal powder of gold, silver, copper, nickel, chromium, palladium, rhodium, ruthenium, indium, aluminum, tungsten, molybdenum, platinum, etc., but also alloy powder of copper-nickel alloy, silver-palladium alloy, copper-tin alloy, silver-copper alloy, copper-manganese alloy, etc. and metal-coated powder obtained by coating the surface of the simple metal powder or alloy powder with silver, etc. Further, examples of the carbon fine particles include carbon black, graphite, carbon nanotubes, etc. Examples of the conductive oxide fine particles include silver oxide, indium oxide, tin oxide, zinc oxide, ruthenium oxide, etc.

In the present embodiment, among these, it is preferable to include at least one type of conductive fine particles selected from silver powder, copper powder, silver-coated powder, copper alloy powder, conductive oxide powder, and carbon fine particles. By using these conductive fine particles (B), the conductive layer having excellent conductivity can be formed without sintering.

The shape of the conductive fine particles (B) is not particularly limited, and an amorphous shape, an agglomerated shape, a scale shape, a microcrystalline shape, a spherical shape, a flake shape, a wire shape, etc. can be appropriately used. From the viewpoint of maintaining the conductivity during molding and the adhesiveness of the conductor pattern to the base material, the agglomerated shape, scale shape, flake shape, and wire shape are preferable.

The average particle size of the conductive fine particles is not particularly limited, and is preferably 0.1 µm or more and 50 µm or less, and more preferably 0.5 µm or more and 30 µm or less from the viewpoint of dispersibility in the conductive composition and the conductivity when used as the conductive layer. In the present embodiment, the average particle size of the conductive fine particles (B) is calculated as follows. Based on the laser diffraction/scattering method described in JISM8511 (2014), an appropriate amount of the conductive fine particles (B) was added to an aqueous solution containing 0.5% by volume of a commercially available surfactant polyoxyethylene octyl phenyl ether (manufactured by Roche Diagnostics: Triton X-100) as the dispersant, and irradiated with ultrasonic waves of 40 W for 180 seconds while being stirred, and then measurement was performed using a laser diffraction/scattering type particle size distribution measuring device (manufactured by Nikkiso Co., Ltd.: Microtrac 9220FRA). The value of the obtained median diameter (D50) was used as the average particle diameter of the conductive fine particles (B).

In the present embodiment, the conductive fine particles (B) can be used alone or in combination of two or more. The content ratio of the conductive fine particles (B) in the conductive composition of the present embodiment is not particularly limited if it is appropriately adjusted according to the applications, and is preferably 50% by mass or more and 95% by mass or less, and more preferably 60% by mass or more and 90% by mass or less, based on the total solid content contained in the conductive composition. If the content ratio of the conductive fine particles (B) is the above-described lower limit value or more, the conductive layer having excellent conductivity can be formed. Further, if the content ratio of the conductive fine particles (B) is the above-described upper limit value or less, the content ratio of the resin (A) can be increased, the film forming properties and the adhesiveness to the base film can be improved, and flexibility can be imparted to the conductive layer.

<Solvent (C)>

In the conductive composition of the present embodiment, the solvent (C) contains, in 100 parts by mass of the solvent (C), 40 parts by mass or more of the solvent (C') that satisfies the following condition (1) and at least one of the conditions (2-1) and (2-2).

(1) The boiling point is 180° C. or higher and 270° C. or lower.

(2-1) The polar parameter $\delta p$ of the Hansen solubility parameter (HSP) is $0 \leq \delta p \leq 5.0$.

(2-2) The hydrogen-bond parameter $\delta h$ of the Hansen solubility parameter (HSP) is $9.8 \leq \delta h \leq 24.0$.

By containing 40% by mass or more of the specific solvent (C') based on the whole solvent, it is possible to produce a molded film for which solvent permeation, dissolution or shrinkage of the resin film serving as the base film is suppressed and tensile force-induced reduction in conductivity is suppressed. The ratio of the solvent (C') is 40% by mass or more and 100% by mass or less, preferably 60% by mass or more, and more preferably 80% by mass or more, based on the whole solvent.

In the solvent (C') that satisfies the condition (2-1), preferably the hydrogen-bond parameter $\delta h$ of the Hansen solubility parameter (HSP) is $2.9 \leq \delta h \leq 9.1$. Further, in the solvent (C') that satisfies the condition (2-2), preferably the polar parameter δp of the Hansen solubility parameter (HSP) is 5.5≤δp≤15.3.

Preferably, the solvent (C') further satisfies the following condition (2-3).

(2-3) The dispersion parameter δd of the Hansen solubility parameter (HSP) is 14.0≤δd≤20.0.

Specific examples of such a solvent (C') include diethylene glycol monomethyl ether (boiling point 194° C., δd=16.2, δp=7.8, δh=12.6), diethylene glycol monoethyl ether (boiling point 202° C., δd=16.1, δp=9.2, δh=12.2), diethylene glycol monobutyl ether (boiling point 231° C., δd=16.0, δp=7.0, δh=10.6), diethylene glycol dibutyl ether (boiling point 256° C., δd=15.8, δp=4.4, δh=4.7), triethylene glycol monomethyl ether (boiling point 249° C., δd=16.2, δp=7.6, δh=12.5), triethylene glycol dimethyl ether (boiling point 220° C., δd=15.8, δp=2.3, δh=8.2), dipropylene glycol monomethyl ether acetate (boiling point 213° C., δd=16.3, δp=4.9, δh=8.0), benzyl alcohol (boiling point 205° C., δd=18.4, δp=6.3, δh=13.7), tetralin (boiling point 207° C., δd=19.6, δp=2.0, δh=2.9), diethylene glycol monobutyl ether acetate (boiling point 239° C., δd=16.0, δp=4.1, δh=8.2), terpineol (boiling point 217° C., δd=13.9, δp=8.0, δh=10.3), triacetin (boiling point 258° C., δd=16.5, δp=4.5, δh=9.1), propylene glycol (boiling point 187° C., δd=16.8, δp=9.3, δh=23.3), 1,3-butylene glycol (boiling point 208° C., δd=16.6, δp=10.0, δh=21.5), 1,4-butylene glycol (boiling point 228° C., δd=16.6, δp=15.3, δh=21.7), dipropylene glycol monopropyl ether (boiling point 212° C., δd=15.5, δp=5.7, δh=11.2), diethylene glycol monopropyl ether boiling point 214° C., δd=16.0, δp=7.2, δh=11.3), dipropylene glycol monomethyl ether (boiling point 190° C., δd=15.5, δp=5.7, δh=11.2), tripropylene glycol monomethyl ether (boiling point 242° C., δd=15.3, δp=5.5, δh=10.4), etc.

The solvent (C) may contain a solvent other than the solvent (C') in an amount of less than 60% by mass. Examples of such a solvent include a solvent (C-1) that satisfies the above condition (1) and does not satisfy the above condition (2), and a solvent (C-2) that does not satisfy the above condition 1 and has a boiling point of less than 180° C.

In the present embodiment, the solvent (C-1) is a solvent that permeates into the base film, dissolves or shrinks. Therefore, when used in combination with the solvent (C'), it is possible to greatly reduce dissolution or shrinkage, but the solvent (C-1) is preferably 40% by mass or less, more preferably 20 mass % or less, and even more preferably 0 mass %, that is, substantially not contained, based on the total amount of the solvent (C). Examples of the solvent corresponding to the solvent (C-1) include diethylene glycol monoethyl ether acetate, gamma butyrolactone, isophorone, etc.

Even if the solvent (C-2) having a boiling point of less than 180° C. does not satisfy the condition (2), the solvent (C-2) evaporates relatively quickly due to the drying heat after screen printing, so that the contact time with the base film is short. Although the solvent (C-2) has a small effect of permeating into the base film, dissolving or shrinking, when used in a large amount, stable continuous printing becomes extremely difficult due to the excessively high volatility during printing. Therefore, the solvent (C-2) is preferably 30% by mass or less based on the total amount of the solvent (C). Examples of the solvent (C-2) having a boiling point of less than 180° C. include 1-methoxypropanol, 2-methoxypropanol, 1-methoxypropyl acetate, 2-methoxypropyl acetate, solvent naphtha, butyl acetate, ethyl acetate, 1-butanol, acetone, cyclohexanone, etc.

The ratio of the solvent (C) to the whole conductive composition of the present embodiment is not particularly limited, and is preferably 5% by mass or more and 60% by mass or less, and more preferably 10% by mass or more and 50% by mass or less from the viewpoint of handleability during screen printing.

<Optional Component>

The conductive composition of the invention may further contain other components as necessary. In addition to the crosslinking agent (D), examples of such other components include, a dispersant, a friction resistance improver, an infrared absorber, an ultraviolet absorber, an aromatic agent, an antioxidant, an organic pigment, an inorganic pigment, a defoamer, a silane coupling agent, a plasticizer, a flame retardant, a moisturizer, etc.

The crosslinking agent (D) is used to crosslink the resin (A). An agent having two or more reactive functional groups capable of forming a crosslink with the reactive functional group of the resin (A) in one molecule can be appropriately selected and used as the crosslinking agent (D). Examples of such a reactive functional group include epoxy group, isocyanate group, blocked isocyanate group, alkyloxyamino group, aziridinyl group, oxetanyl group, carbodiimide group, β-hydroxyalkylamide group, etc. When the crosslinking agent (D) is used, the ratio thereof is preferably 0.05 parts by mass or more and 30 parts by mass or less, and more preferably 1 part by mass or more and 25 parts by mass or less, based on 100 parts by mass of the resin (A).

Furthermore, in the present embodiment, a resin that has two or more first reactive functional groups selected from a hydroxy group, an amino group, a carboxyl group, and an acid anhydride group in one molecule and a weight average molecular weight of 20,000 or more and 600,000 or less is selected as the resin (A). An agent that has two or more second reactive functional groups capable of forming a crosslink with the first reactive functional group in one molecule is selected as the crosslinking agent (D). It is particularly preferable to combine the resin (A) and the crosslinking agent (D) so that the ratio between the total amount $F_D$ (mol) of the substance amount of the second reactive functional group of the crosslinking agent (D) and the mass $M_A$ (g) of the resin (A) satisfies the following formula (1).

$$5.0 \times 10^{-5} \leq F_D/M_A \leq 6.0 \times 10^{-4} \qquad \text{Formula (1)}$$

Here, an example of calculating the total amount $F_D$ (mol) of the substance amount of the second reactive functional group of the crosslinking agent (D) will be illustrated. As an example, when 10 g of a crosslinking agent having a molecular weight of 600 and having three second reactive functional groups in one molecule is used, $F_D$=(3/600)× 10=0.05 (mol). At this time, when the mass of the resin (A) to be combined is 500 (g), $F_D/M_A$=0.05 (mol)/500 (g)=1.0× $10^{-4}$ (mol/g), so the combination satisfies the formula (1). By using such a combination, it is possible to obtain a conductive layer which has both flexibility and hardness and for which tensile force-induced reduction in conductivity is suppressed.

<Method for Producing Conductive Composition>

The production method of the conductive composition of the present embodiment may be any method for dissolving or dispersing the resin (A), the conductive fine particles (B), and other components used as necessary into the solvent (C), and can be produced by mixing by a known mixing means.

[Molded Film]

Figure 2:
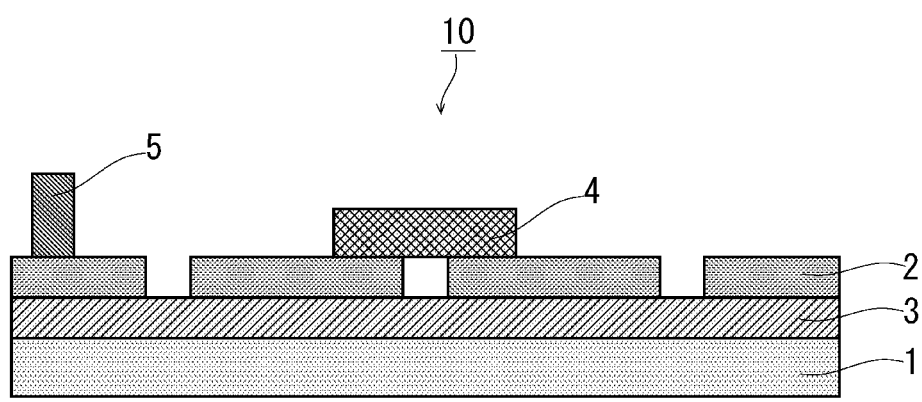
FIG. 2 is a schematic cross-sectional view showing another example of the molded film of the present embodiment.

The molded film of the present embodiment is a molded film including a conductive layer on a base film, and the conductive layer is a cured product of the conductive composition for molded film. With the molded film of the present embodiment, it is possible to obtain a molded article with a conductive circuit formed on any base material surface such as an uneven surface or a curved surface. The layered structure of the molded film of the present embodiment will be described with reference to FIG. 1 and FIG. 2. FIG. 1 and FIG. 2 are schematic cross-sectional views showing an example of the molded film of the present embodiment. The molded film 10 shown in the example of FIG. 1 is provided with a conductive layer 2 on a base film 1. The conductive layer 2 may be formed on the entire surface of the base film 1 or may be formed in a desired pattern as shown in the example of FIG. 1. The molded film 10 shown in the example of FIG. 2 has a decorative layer 3 on the base film 1, and includes the conductive layer 2 on the decorative layer 3. Further, as shown in the example of FIG. 2, the molded film 10 may include an electronic component 4, and a pin 5 for connecting to an extraction circuit on the conductive layer 2. Although not shown, a resin layer for protecting the conductive layer or the electronic component may be provided on the conductive layer 2 or the electronic component 4. The resin layer may be an adhesive layer or a bonding layer for improving the adhesiveness with the base material described later. Although not shown, when the molded film 10 of the present embodiment includes the decorative layer 3, in addition to the example of FIG. 2, the molded film 10 may have a layered structure that has the decorative layer 3 on one surface of the base film 1, and includes the conductive layer 2 on the other surface. The molded film of the present embodiment includes at least the base film and the conductive layer, and may have other layers as necessary. Each layer of such a molded film will be described hereinafter.

<Base Film>

In the present embodiment, the base film can be appropriately selected from films that have flexibility and stretchability which allow them to follow the shape of the base material surface under the molding temperature condition at the time of forming the molded article, and is preferably selected according to the applications of the molded article, the production method of the molded article, etc. For example, when the overlay molding method or the film insert method described later is adopted as the production method of the molded article, since the base film remains in the molded article, the base film can be selected in consideration of the function as a protective layer of the conductive layer. On the other hand, when the in-mold transfer method described later is adopted as the production method of the molded article, it is preferable to select a base film having peelability.

The base film can be appropriately selected from the above viewpoint, and may be a film of polycarbonate, polymethylmethacrylate, polyethylene terephthalate, polystyrene, polyimide, polyamide, polyether sulfone, polyethylene naphthalate, polybutylene terephthalate, polyvinyl chloride, polyethylene, polypropylene, cycloolefin polymer, ABS (acrylonitrile-butadiene-styrene copolymer resin), AES (acrylonitrile-ethylene-styrene copolymer resin), kydac (acrylic modified vinyl chloride resin), modified polyphenylene ether, polymer alloy composed of two or more of these resins, or a laminated film of these, for example. Among these, a film selected from polycarbonate, polymethylmethacrylate, or polyethylene terephthalate is preferable. Among these, a laminated film of polycarbonate and polymethylmethacrylate is preferable as the laminated film. The production method of the laminated film of polycarbonate and polymethylmethacrylate is not particularly limited, and a polycarbonate film and a polymethylmethacrylate film may be bonded and laminated, or polycarbonate and polymethylmethacrylate may be coextruded to form a laminated film.

In addition, if necessary, an anchor coat layer may be provided on the base film for the purpose of improving the printability of the conductive composition, and the conductive composition may be printed on the anchor coat layer. The anchor coat layer is not particularly limited if it has good adhesiveness with the base film and also good adhesiveness with the conductive composition, and follows the film at the time of molding. In addition, organic fillers such as resin beads and inorganic fillers such as metal oxides may be added as necessary. The method for providing the anchor coat layer is not particularly limited, and the anchor coat layer can be obtained by coating, drying and curing by a conventionally known coating method. Further, if necessary, a hard coat layer may be provided on the base film to prevent the surface of the molded article from being scratched, and the conductive composition and, if necessary, the decorative layer may be printed on the opposite surface. The hard coat layer is not particularly limited if it has good adhesiveness with the base film and also good surface hardness, and follows the film at the time of molding. In addition, organic fillers such as resin beads and inorganic fillers such as metal oxides may be added as necessary. The method for providing the hard coat layer is not particularly limited, and the hard coat layer can be obtained by coating, drying and curing by a conventionally known coating method.

Furthermore, if the molded film of the present embodiment has the decorative layer, it is preferable to select a transparent base film.

The thickness of the base film is not particularly limited, and can be set to, for example, 10 μm or more and 500 μm or less, and preferably 20 μm or more and 450 μm or less.

<Conductive Layer>

The conductive layer in the molded film of the present embodiment is a cured product of the conductive composition. The method for forming the conductive layer is not particularly limited. In the present embodiment, the conductive layer is preferably formed by a screen printing method, a pad printing method, a stencil printing method, a screen offset printing method, a dispenser printing method, a gravure offset printing method, a reverse offset printing method, and a microcontact printing method, and more preferably by the screen printing method. In the screen printing method, it is preferable to use a fine mesh screen, particularly preferably a fine mesh screen of about 300 to 650 meshes, in order to cope with the high definition of the conductive circuit pattern. The open area of the screen at this time is preferably about 20 to 50%. The screen wire diameter is preferably about 10 to 70 μm. Examples of the screen plate type include polyester screen, combination screen, metal screen, nylon screen, etc. Further, when printing the conductive layer in a high-viscosity paste state, a high-tensile stainless screen can be used. The squeegee for screen printing may have a round shape, a rectangular shape or a square shape, and an abrasive squeegee can be used to reduce the attack angle (angle between the plate and the squeegee at the time of printing). Other printing conditions may be obtained by appropriately designing conventionally known conditions.

After the conductive composition is printed by screen printing, the conductive composition is cured by heating and drying. In addition, if the conductive composition contains the crosslinking agent (D), the conductive composition is further cured by heating to cause a crosslinking reaction.

The heating temperature is preferably 80° C. to 230° C. and the heating time is preferably 10 minutes to 120 minutes in order to sufficiently volatilize the solvent when the crosslinking agent is not contained, and to sufficiently volatilize the solvent and carry out the crosslinking reaction when the crosslinking agent is contained. Thereby, a patterned conductive layer can be obtained. The patterned conductive layer may be provided with an insulating layer so as to cover the conductive pattern, as necessary. The insulating layer is not particularly limited, and a known insulating layer can be used.

The film thickness of the conductive layer is not particularly limited and may be appropriately adjusted according to the required conductivity, etc. The film thickness can be set to, for example, 0.5 μm or more and 20 μm or less, and is preferably 1 μm or more and 15 μm or less.

<Decorative Layer>

The molded film of the present embodiment may have a decorative layer considering the designability of the obtained molded article. The decorative layer may be a layer having a monochromatic tint, or may have any pattern. As an example, the decorative layer can be formed by preparing a decorative ink containing a colorant, a resin, and a solvent, and then applying the decorative ink to the base film by a known printing means. The colorant can be appropriately selected from known pigments and dyes to be used. In addition, as the resin, it is preferable to appropriately select and use the same resin as the resin (A) in the conductive composition of the present embodiment. The thickness of the decorative layer is not particularly limited, and can be, for example, 0.5 μm or more and 10 μm or less, and preferably 1 μm or more and 5 μm or less.

When the molded film of the present embodiment has the base film and the conductive layer, the relationship between the breaking elongation rates of the respective layers at the softening point temperature of the base film is preferably satisfies:

breaking elongation rate of the base film>breaking elongation rate of the conductive layer.

Further, when the molded film of the present embodiment has the base film, the decorative layer, and the conductive layer in this order, the relationship between the breaking elongation rates of the respective layers at the softening point temperature of the base film preferably satisfies:

breaking elongation rate of the base film>breaking elongation rate of the decorative layer>breaking elongation rate of the conductive layer.

By satisfying such relationships, it is possible to prevent the tensile force from concentrating on the conductive layer and exerting a large mechanical load, and tensile force-induced reduction in conductivity is suppressed.

[Molded Article]

The molded article of the present embodiment is a molded article in which at least a conductive layer is laminated on a base material, and the conductive layer is a cured product of the conductive composition for molded film according to any one of claims 1 to 5. Since the molded article of the present embodiment is formed by the molded film using the conductive composition for molded film of the present embodiment, the molded article has a conductive circuit formed on any surface such as an uneven surface or a curved surface. Regarding the method for producing the molded article of the present embodiment, three embodiments will be described hereinafter. Nevertheless, the molded article of the present embodiment is not necessarily produced by these methods as long as it is produced using the conductive composition of the present embodiment.

<First Production Method>

The first production method of the molded article according to the present embodiment includes: a step of producing a molded film by printing and drying the conductive composition for molded film of the present embodiment on a base film; a step of arranging the molded film on a base material, and a step of integrating the molded film and the base material by an overlay molding method. The following will be described with reference to FIG. 3A to FIG. 3C, but since the method of producing the molded film is as described above, description thereof will be omitted here.

Figure 3A:
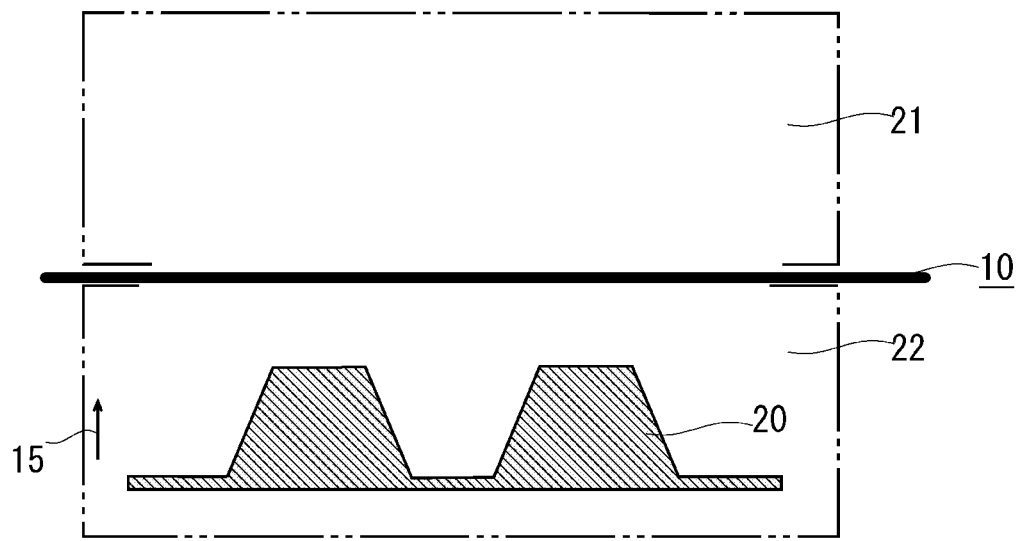
FIG. 3A is a schematic process view showing an example of the first production method of the molded article, and is a cross-sectional view showing the arrangement of the molded film and the base material in the chamber box.
Figure 3B:
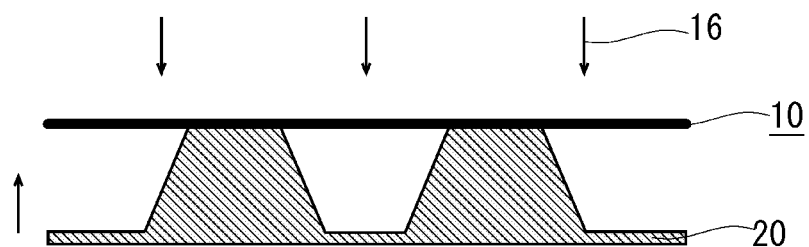
FIG. 3B is a schematic process view showing an example of the first production method of the molded article, and is a cross-sectional view showing the state when the molded film and the base material are in contact with each other.
Figure 3C:
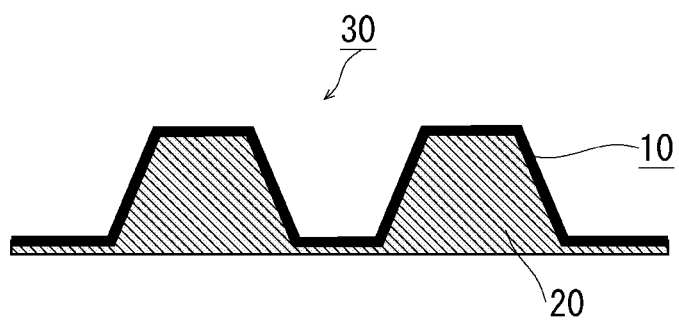
FIG. 3C is a schematic process view showing an example of the first production method of the molded article, and is a cross-sectional view showing the state where the molded film and the base material are bonded and integrated.

FIG. 3A to FIG. 3C are schematic process views showing an example of the first production method of the molded article. FIG. 3A to FIG. 3C respectively show a molded film 10 and a base material 20 arranged in a chamber box of a TOM (Three dimension Overlay Method) molding machine, and the chamber box is omitted in FIG. 3B and FIG. 3C. In the first production method, first, the base material 20 is disposed on the table of the lower chamber box 22. Next, the molded film 10 of the present embodiment is arranged on the base material 20 through the upper chamber box 21 and the lower chamber box 22 (FIG. 3A). At this time, the molded film 10 may be arranged so that the conductive layer faces either the side of the base material 20 or the opposite side of the base material 20, which is selected according to the final applications of the molded article. Next, the upper and lower chamber boxes are evacuated, and then the molded film is heated. Then, the base material 20 is raised 15 by raising the table. Next, only the upper chamber box 21 is opened to the atmosphere (FIG. 3B). At this time, the molded film is pressed 16 toward the base material side, and the molded film 10 and the base material 20 are bonded and integrated (FIG. 3C). In this way, the molded article 30 can be obtained.

In the first production method, the base material 20 can be prepared in advance by any method. In the first production method, the material of the base material 20 is not particularly limited, and may be resin or metal.

<Second Production Method>

The second production method of the molded article according to the present embodiment includes: a step of producing a molded film by printing and drying the conductive composition for molded film of the present embodiment on a base film; a step of molding the molded film into a predetermined shape; a step of arranging the molded film that has been molded in a mold for injection molding; and a step of molding the base material by injection molding, and integrating the molded film and the base material. The following will be described with reference to FIG. 4A to FIG. 4E. The second production method may be called a film insert method.

Figure 4A:
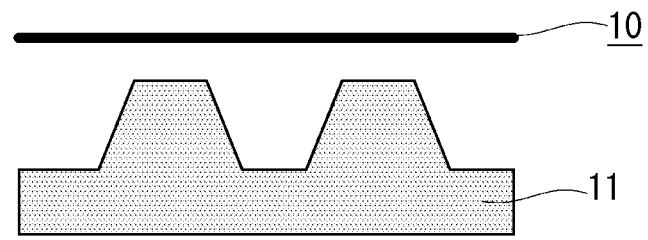
FIG. 4A is a schematic process view showing another example of the second production method of the molded article, and is a cross-sectional view showing the state where the molded film is arranged above the mold.
Figure 4B:
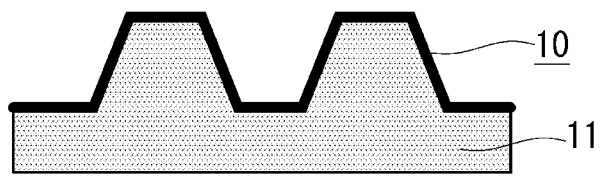
FIG. 4B is a schematic process view showing another example of the second production method of the molded article, and is a cross-sectional view showing the state where the molded film is molded by the mold.
Figure 4C:
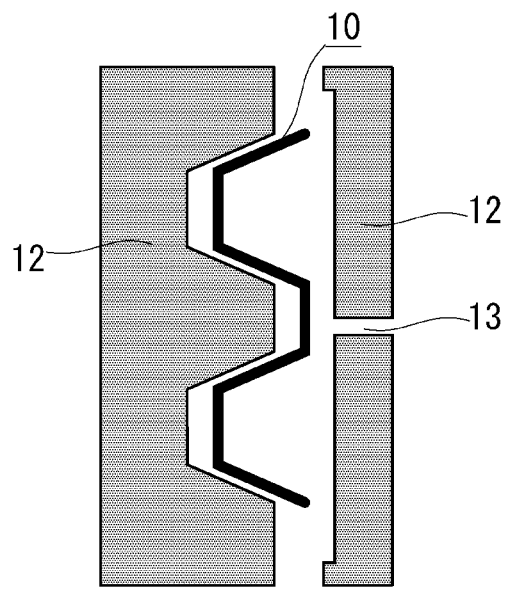
FIG. 4C is a schematic process view showing another example of the second production method of the molded article, and is a cross-sectional view showing the state where the molded film is arranged in the mold for injection molding.
Figure 4D:
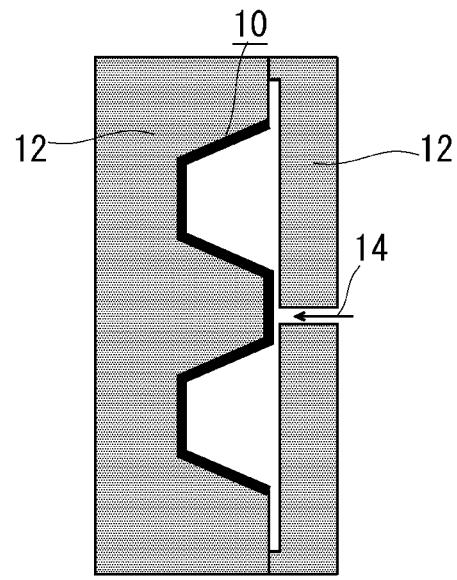
FIG. 4D is a schematic process view showing another example of the second production method of the molded article, and is a cross-sectional view showing the state where the molded film is arranged in the mold for injection molding.
Figure 4E:
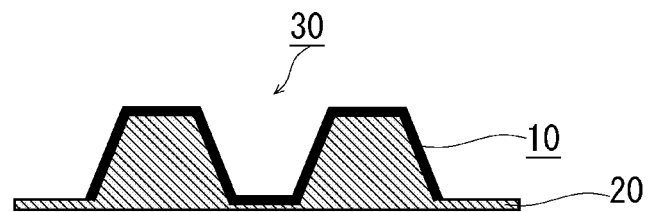
FIG. 4E is a schematic process view showing another example of the second production method of the molded article, and is a cross-sectional view showing the state where the molded film and the base material are bonded and integrated.

FIG. 4A to FIG. 4E are schematic process views showing an example of the second production method of the molded article. In the second production method, a molded film 10 is molded into a predetermined shape in advance by a mold 11 (FIG. 4A). The molded film 10 is sucked into the mold by vacuum or pressed into the mold by compressed air, or both, after or while being softened by heating to be molded by the mold 11 (FIG. 4B). At this time, the molded film 10 may be molded so that the conductive layer faces either the side of the base material 20 described below or the opposite side of the base material 20, which is selected according to the final applications of the molded article. Next, the molded film 10 that has been molded is arranged in a mold 12 for injection molding (FIG. 4C to FIG. 4D). Next, resin is injected 14 from an opening 13 to form the base material 20, and the molded film 10 and the base material 20 are integrated to obtain the molded article 30 (FIG. 4E).

In the second production method, it is not necessary to prepare the base material 20 in advance, and the molding of the base material and the integration with the molded film can be performed at the same time. The material of the base material 20 can be appropriately selected from known resins used for injection molding.

<Third Production Method>

The third production method of the molded article according to the present embodiment includes: a step of producing a molded film by printing and drying the conductive composition for molded film of the present embodiment on a base film by screen printing; a step of arranging the molded film in a mold for injection molding; and a step of molding the base material by injection molding, and transferring the conductive layer in the molded film to the base material side. The following will be described with reference to FIG. 5A to FIG. 5C. The third production method may be called an in-mold transfer method.

Figure 5A:
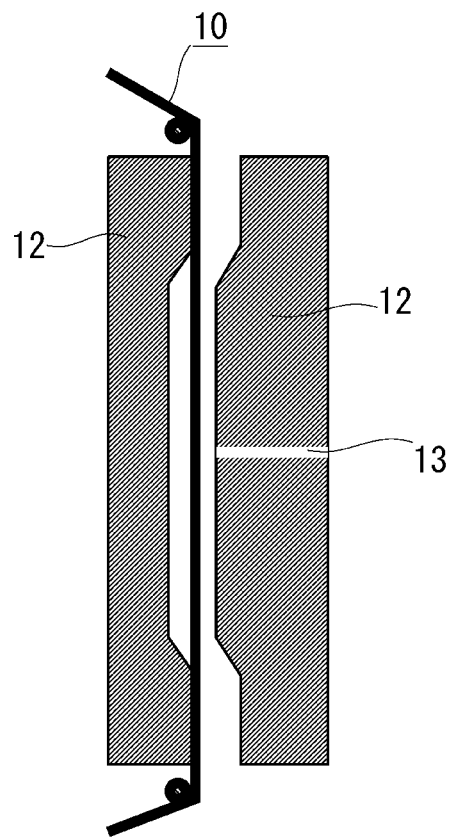
FIG. 5A is a schematic process view showing another example of the third production method of the molded article, and is a cross-sectional view showing the state where the molded film is arranged in the mold for injection molding.
Figure 5B:
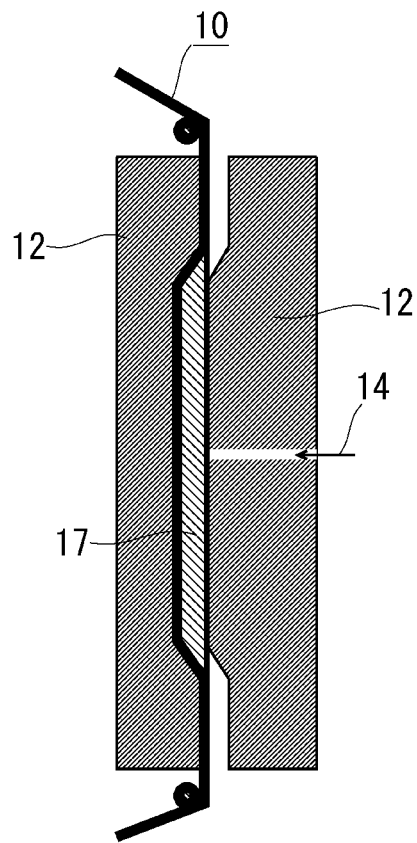
FIG. 5B is a schematic process view showing another example of the third production method of the molded article, and is a cross-sectional view showing the state where the resin for injection molding is injected.
Figure 5C:
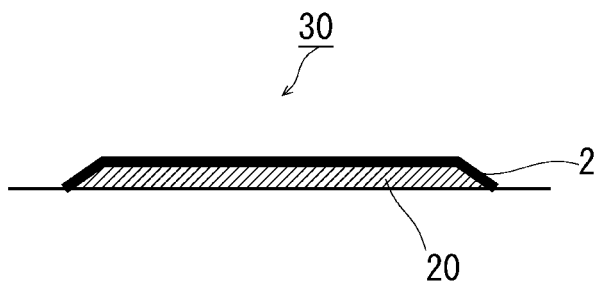
FIG. 5C is a schematic process view showing another example of the third production method of the molded article, and is a cross-sectional view showing the state where the molded film and the base material are bonded and integrated.

FIG. 5A to FIG. 5C are schematic process views showing an example of the third production method of the molded article. In the third production method, the molded film 10 selects and uses a film having peelability as the base film. The molded film 10 is arranged in a mold 12 for injection molding so that the conductive layer faces the side of the base material 20 described later (FIG. 5A). Next, resin 17 is injected 14 from an opening 13 to form the base material 20, the molded film 10 and the base material 20 are in close contact with each other, at least the conductive layer is transferred to the side of the base material 20 (FIG. 5B), and the molded article 30 is obtained (FIG. 5C). In addition, when the molded film 10 has a decorative layer, the decorative layer and the conductive layer are transferred.

In the third production method, it is not necessary to cut the base film, so a long base film can be arranged as shown in the example of FIG. 5A to FIG. 5C. The material of the base material 20 can be appropriately selected from known resins used for injection molding.

The molded article obtained in this way makes it possible to mount circuits, touch sensors, and various electronic components on plastic housings such as home appliances, automobile components, robots, and drones. In addition, it is extremely useful for making electronic devices lighter, thinner, shorter, smaller, more flexible in design, and more multifunctional.

Embodiment

Hereinafter, the invention will be described in more detail with reference to the embodiments, but the following embodiments do not limit the invention in any way. In the embodiments, "part" means "part by mass" and "%" means "% by mass". In addition, the weight average molecular weight in the embodiments is a polystyrene equivalent molecular weight measured by GPC (gel permeation chromatography) "HLC-8320" manufactured by Tosoh Corporation.

The "functional group value" in the embodiments is based on the molecular weight per functional group of each raw material (this is set as the functional group equivalent), and the functional group amount per 1 g of the raw material is expressed as an equimolar amount of potassium hydroxide equivalent mass (mg) according to the following calculation formula.

(functional group value) [mgKOH/g]=(56.1×1000)/ (functional group equivalent)

The functional group value is a generic term for the amount expressed as an acid value when the functional group is a carboxyl group, a generic term for the amount expressed as a hydroxyl value when the functional group is a hydroxy group, and is a generic term for the amount expressed as an amine value or the like when the functional group is an amino group, for example. When the functional group ratios of substances having different functional groups are compared, it may be considered that they have the same molar amount of functional groups if the functional group values are the same.

Regarding the above functional group value, when titration of potassium hydroxide is used to quantify functional groups such as carboxyl and hydroxy groups, for example, the measured values (acid value and hydroxyl value) can also be directly obtained from the titration amount of potassium hydroxide used for neutralization using a publicly known measuring method defined in JIS K 0070, and can be treated in the same way as the value calculated by the above calculation formula. Also, if the above-mentioned titration with potassium hydroxide is not used to quantify the functional group value such as isocyanate groups, it can still be conveniently calculated as a potassium hydroxide equivalent amount using the above-mentioned functional group equivalent derived from each measured value representing the functional group amount and the above-mentioned calculation formula. A specific calculation example is shown below.

Calculation example: As a compound having an isocyanate group, a trifunctional isocyanate compound "X" having an isocyanate amount of 23% measured by a method defined in JIS K 6806 (method of reacting the isocyanate group with n-dibutylamine and titrating the remaining n-dibutylamine with aqueous hydrochloric acid) is calculated. The functional group equivalent of the trifunctional isocyanate compound "X" is derived from the above isocyanate amount (%) and the molecular weight of the isocyanate group (NCO=44 g/mol) as follows.

(functional group equivalent of "X")=1/(0.23/44) =191.3

From the functional group equivalent of the trifunctional isocyanate compound "X" and the above calculation formula of the functional group value, the functional group value of the trifunctional isocyanate compound "X" can be calculated as follows.

(functional group value of trifunctional isocyanate compound "X") [mgKOH/g]=(56.1×1000)/ 191.3=293.3

<Resins (A1) and (A2)>

The following resins were used as the resins (A1) and (A2).

Resin (A1): phenoxy resin manufactured by Mitsubishi Chemical Corporation, jER-4250, which has a weight average molecular weight of 55,000, a glass transition point of 78° C., and contains two or more hydroxy groups (hydroxyl group value 208 mgKOH/g) and epoxy groups (epoxy group value 5 mgKOH/g) in each molecule.

Resin (A2): acrylic resin manufactured by Mitsubishi Chemical Corporation, Dianal BR-108, which has a weight average molecular weight of 550,000, a glass transition point of 90° C., and has no reactive functional group.

<Synthesis Example 1: Synthesis of Resin (A3)>

In a reactor equipped with a stirrer, a thermometer, a rectification pipe, a nitrogen gas introduction pipe, and a decompression device, 20.3 parts of dimethyl terephthalate, 20.3 parts of dimethyl isophthalate, 12.9 parts of ethylene glycol, 18.2 parts of neopentyl glycol, and 0.03 parts of tetrabutyl titanate were added, and gradually heated to 180° C. while being stirred under a nitrogen stream, and transesterification was performed at 180° C. for 3 hours. Then, 28.3 parts of sebacic acid was added and gradually heated to 180 to 240° C., and esterification reaction was performed. The reaction was performed at 240° C. for 2 hours and the acid value was measured, and when it was 15 or less, the pressure in the reactor was gradually reduced to 1 to 2 torr. When a predetermined viscosity was reached, the reaction was stopped and the product was taken out and then transferred to a pallet having a fluorinated surface and cooled, thereby obtaining a polyester resin (A3) solid having a weight average molecular weight of 45,000, a glass transition point of 60° C., and containing two or more hydroxy groups (hydroxyl value of 5 mgKOH/g) in one molecule.

<Synthesis Example 2: Synthesis of Resin (A4)>

In a reactor equipped with a stirrer, a thermometer, a reflux cooling pipe, and a nitrogen gas introduction pipe, 127.4 parts of polyester polyol ("Kuraray polyol P-2030" manufactured by Kuraray Co., Ltd.) obtained from isophthalic acid and 3-methyl-1,5-pentanediol, 4.2 parts of dimethylolbutanoic acid, 19.2 parts of isophorone diisocyanate, and 32.5 parts of dipropylene glycol monomethyl ether acetate were added and reacted at 90° C. for three hours under a nitrogen stream, and then 193.7 parts of dipropylene glycol monomethyl ether acetate was added, thereby obtaining a urethane resin (A4) solution with non-volatile content of 40%, having a weight average molecular weight of 34,000, a glass transition point of 12° C., and being composed of 60% of urethane resin (A3) containing two or more hydroxyl groups (hydroxyl value 4 mgKOH/g) and carboxyl groups (acid value 10 mgKOH/g) in one molecule, and 40% of dipropylene glycol monomethyl ether acetate solvent.

The following were used as the conductive fine particles, the solvents, and the crosslinking agent.

<Conductive Fine Particles (B1) to (B5)>

Conductive fine particles (B1): manufactured by Fukuda Metal Foil & Powder Co., Ltd., flake silver powder, having an average particle diameter of 5.2 μm Conductive fine particles (B2): manufactured by Fukuda Metal Foil & Powder Co., Ltd., chain-aggregated silver powder, having an average particle diameter of 1.7 μm Conductive fine particles (B3): manufactured by Mitsui Mining & Smelting Co., Ltd., silver-coated copper powder, having a silver coating amount of 10%, and an average particle diameter of 2 μm Conductive fine particles (B4): Ishihara Sangyo Kaisha, Ltd., needle-shaped conductive tin oxide powder, having an average particle diameter of 1 μm Conductive fine particles (B5): manufactured by Ito Graphite Co., Ltd., expanded graphite, having an average particle diameter of 15 μm <Solvents (C'1) to (C'5)>
<Solvents (C'1) to (C'13)>

Solvent (C'1): diethylene glycol monobutyl ether, having a boiling point of 231° C., δd=16.0, δp=7.0, δh=10.6

Solvent (C'2): triethylene glycol monomethyl ether, having a boiling point of 249° C., δd=16.2, δp=7.6, δh=12.5

Solvent (C'3): tetralin, having a boiling point of 207° C., δd=19.6, δp=2.0, δh=2.9

Solvent (C'4): benzyl alcohol, having a boiling point of 205° C., δd=18.4, δp=6.3, δh=13.7

Solvent (C'5): dipropylene glycol monomethyl ether acetate, having a boiling point of 213° C., δd=16.3, δp=4.9, δh=8.0

Solvent (C'6): diethylene glycol monobutyl ether acetate, having a boiling point of 239° C., δd=16.0, δp=4.1, δh=8.2

Solvent (C'7): terpineol, having a boiling point of 217° C., δd=13.9, δp=8.0, δh=10.3

Solvent (C'8): diethylene glycol monomethyl ether, having a boiling point of 194° C., δd=16.2, δp=7.8, δh=12.6

Solvent (C'9): diethylene glycol monoethyl ether, having a boiling point of 202° C., δd=16.1, δp=9.2, δh=12.2

Solvent (C'10): triacetin, having a boiling point of 258° C., δd=16.5, δp=4.5, δh=9.1

Solvent (C'11): diethylene glycol dibutyl ether, having a boiling point of 256° C., δd=15.8, δp=4.4, δh=4.7

Solvent (C'12): triethylene glycol dimethyl ether, having a boiling point of 220° C., δd=15.8, δp=2.3, δh=8.2

Solvent (C'13): propylene glycol, having a boiling point of 187° C., δd=16.8, δp=9.3, δh=23.3

<Solvents (C14) to (C17)>

Solvent (C14): diethylene glycol monoethyl ether acetate, having a boiling point of 217° C., δd=16.2, δp=5.1, δh=9.2

Solvent (C15): gamma butyrolactone, having a boiling point of 204° C., δd=19.0, δp=16.1, δh=7.4

Solvent (C16): isophorone, having a boiling point of 215° C., δd=16.6, δp=8.2, δh=7.4

Solvent (C17): 2-methoxypropanol, having a boiling point of 120° C., δd=15.6, δp=6.3, δh=11.6

<Crosslinking Agents (D1) and (D2)>

Crosslinking Agent (D1):

Blocked isocyanate solution manufactured by Baxeneden Chemicals, Trixene B17982, containing 3 blocked isocyanate groups in one molecule (functional group value 195 mgKOH/g), and having a non-volatile content of 70% (solvent (C17): 2-methoxypropanol)

Crosslinking Agent (D2):

Glycidylamine manufactured by Nippon Kayaku Co., Ltd., GOT, containing two epoxy groups in one molecule (functional group value 415 mgKOH/g), and having a non-volatile content of 100%

<Production Example 1: Preparation of Decorative Ink (F1)>

175 parts of resin solution (A3) (70 parts as resin (A3) only) was prepared, and stirred and mixed with 10 parts of phthalocyanine blue pigment (LIONOL BLUE FG7351 manufactured by Toyo Color Co., Ltd.) and 20 parts by mass of titanium oxide pigment (TIPAQUE CR-93 manufactured by Ishihara Sangyo Kaisha, Ltd.), and after kneading with a 3-roll mill (manufactured by Kodaira Seisakusho Co., Ltd.), 5 parts of an isocyanate curing agent (Desmodur N3300 manufactured by Sumika Covestro Urethane Co., Ltd., non-volatile content 100%) and 90 parts of toluene were added and stirred and mixed evenly, thereby obtaining the decorative ink (F1).

<Embodiment 1: Preparation of Conductive Composition for Molded Film (E1)>

20.0 parts of resin (A1) was dissolved in 30.0 parts of solvent (C'1), and 80.0 parts of conductive fine particles (B1) were stirred and mixed, and kneaded with a 3-roll mill (manufactured by Kodaira Seisakusho Co., Ltd.), thereby obtaining the conductive composition for molded film (E1).

<Embodiments 2 to 16: Preparation of Conductive Compositions for Molded Film (E2) to (E16)>

In Embodiment 1, the conductive compositions for molded film (E2) to (E16) were obtained in the same manner as Embodiment 1 except that the types and amounts of the resins, solvents, and conductive fine particles were changed as shown in Table 1 and a crosslinking agent was further added as necessary. The numerical value of each material in Tables 1 to 3 is parts by mass.

<Comparative Examples 1 to 3: Preparation of Conductive Compositions for Molded Film (E17) to (E19)>

In Embodiment 1, the conductive compositions for molded film (E17) to (E19) were obtained in the same manner as Embodiment 1 except that the types and amounts of the resins, solvents, and conductive fine particles were changed as shown in Table 3.

<Embodiments 17 to 32 and Comparative Examples 4 to 6>

On a polycarbonate (PC) film (manufactured by Teijin Ltd., Panlite 2151, thickness 300 μm) base material (300 mm×210 mm), the conductive compositions for molded film (E1) to (E14) were respectively printed by a screen printer (manufactured by Minoscreen, Minomat SR5575 semi-automatic screen printer). Then, by heating at 120° C. for 30 minutes in a hot air drying oven, a molded film having a rectangular solid shape with a width of 15 mm, a length of 30 mm, and a thickness of 10 μm and including a conductive layer having a linear pattern with a line width of 3 mm, a length of 60 mm, and a thickness of 10 μm was obtained.

<Embodiments 33 to 48 and Comparative Examples 7 to 9>

In the above Embodiments 17 to 32, a molded film was obtained in the same manner as Embodiments 17 to 32 except that an acrylic resin film (manufactured by Sumitomo Chemical Co., Ltd., Technolloy S001G, thickness 250 μm) base material (300 mm×210 mm) was used instead of a polycarbonate film base material, and the drying condition in the hot air drying oven was 80° C. for 30 minutes.

<Embodiment 49>

In the above Embodiment 33, a molded film was obtained in the same manner as Embodiment 33 except that a polycarbonate resin/acrylic resin two-type two-layer coextrusion film (manufactured by Sumitomo Chemical Co., Ltd., Technolloy C001, thickness 125 μm) base material (300 mm×210 mm) was used instead of an acrylic resin film base material, and the conductive composition for molded film was printed on the polycarbonate resin side.

<Embodiment 50>

On a polycarbonate film (manufactured by Teijin Ltd., Panlite 2151, thickness 300 μm) base material (300 mm×210 mm), the decorative ink (F1) was applied using a blade coater to obtain a dry film thickness of 2 μm, and heated at 120° C. for 30 minutes to form a decorative layer. Then, in the above Embodiments 17 to 32, a molded film in which a polycarbonate film, a decorative ink layer, and a conductor were laminated in this order was obtained in the same manner as Embodiments 17 to 32 except that the film with the decorative layer was used instead of the polycarbonate film, and the conductive layer was formed on the decorative layer.

[(1) Measurement of Volume Resistivity]

Regarding the rectangular solid conductive layers of 15 mm×30 mm formed on the molded films of Embodiments 17 to 50 and Comparative Examples 4 to 9, the volume resistivity (Ω·cm) was measured using a resistivity meter (manufactured by Mitsubishi Chemical Analytech, Loresta GP MCP-T610 type resistivity meter, based on JIS-K7194, 4-terminal 4-probe method constant current application method) (4 terminal probes at intervals of 0.5 cm). The results are shown in Tables 1 to 3.

[(2) Evaluation of Peeling Adhesiveness]

For the rectangular solid conductive layers of 15 mm×30 mm formed on the molded films of Embodiments 17 to 50 and Comparative Examples 4 to 9, a Gardener 1 mm interval cross-cut guide was used with a cutter knife to make 10×10 square grid-like cuts so as to penetrate the conductive layer, a cellophane tape manufactured by Nichiban Co., Ltd. was attached, and the air that has been bitten in was removed to ensure good contact, and then it was peeled off vertically. The degree of peeling of the coating film was evaluated as follows according to the ASTM-D3519 standard. The results are shown in Tables 1 to 3.

(Criteria for Evaluating Peeling Adhesiveness)

A: Evaluations 5B to 4B, excellent adhesiveness

B: 5B to 4B in evaluation, but the coating film undergoes cohesive failure and part of the coating film on the surface side is detached C: Evaluation 3B or less, poor adhesiveness

[(3) Evaluation of Wiring Resistance]

A measurement coupon was prepared by cutting out to be 70 mm in the longitudinal direction and 10 mm in the width direction so that the conductive layers having a linear pattern of 3 mm×60 mm, formed on the molded films of Embodiments 17 to 50 and Comparative Examples 4 to 9, were in the center. On the surface opposite to the conductive layer on the measurement coupon, two lines were added at 4 cm intervals with an oil-based marker with a line perpendicular to the conductive layer from the longitudinal direction end as a mark. According to this mark, the resistance value was measured at the position at the interval of 4 cm using a tester, and measured value was taken as the wiring resistance (Ω). The results are shown in Tables 1 to 3.

[(4) Thermal Stretching Evaluation 1]

The measurement coupons of Embodiments 17 to 32, 49, and 50 and Comparative Examples 4 to 6 were stretched in a heating oven at 160° C. in the longitudinal direction at a stretching speed of 10 mm/min to an elongation rate of 50%. After they were taken out from the oven and cooled, an optical microscope was used to evaluate whether disconnection occurred. In addition, the wiring resistance (Ω) at the position corresponding to the 4 cm interval based on the original mark reference was measured in the same manner as the above measurement of the wiring resistance, and the wiring resistance after stretching/the wiring resistance before stretching was taken as the resistance variation rate during thermal stretching (times), and each was evaluated according to the following criteria. The results are shown in Tables 1 and 3.

(Presence or Absence of Disconnection)

A: No disconnection was observed

B: 1 to 2 minor cracks were confirmed

C: Severe disconnection or peeling of the conductive coating film was confirmed (Resistance Variation Rate During Thermal Stretching)

A: 5 times or more and less than 10 times

B: 10 times or more and less than 100 times

C: 100 times or more

The elongation rate is a value calculated as follows.

$$(\text{Elongation rate}) [\%] = \{(\text{length after stretching} - \text{length before stretching})/(\text{length before stretching})\} \times 100$$

[(5) Thermal Stretching Evaluation 2]

In the above thermal stretching evaluation 1, evaluation was made in the same manner as the above thermal stretching evaluation 1 according to the following criteria except that the elongation ratio was changed to 100%. The results are shown in Tables 1 and 3.
(Presence or Absence of Disconnection)
A: No disconnection was observed
B: 1 to 2 minor cracks were confirmed
C: Severe disconnection or peeling of the conductive coating film was confirmed
(Resistance Variation Rate During Thermal Stretching)
A: 10 times or more and less than 100 times
B: 100 times or more and less than 1000 times
C: 1000 times or more

[(6) Thermal Stretching Evaluation 3]

The measurement coupons of Embodiments 33 to 48 and Comparative Examples 4 to 9 were stretched in a heating oven at 120° C. in the longitudinal direction at a stretching speed of 10 mm/min to an elongation rate of 50%. After they were taken out from the oven and cooled, an optical microscope was used to evaluate whether disconnection occurred. In addition, the wiring resistance (Ω) at the position corresponding to the 4 mm interval based on the original mark reference was measured in the same manner as the above measurement of the wiring resistance, and the wiring resistance after stretching/the wiring resistance before stretching was taken as the resistance variation rate during thermal stretching (times), and each was evaluated according to the following criteria. The results are shown in Tables 2 and 3.
(Presence or Absence of Disconnection)
A: No disconnection was observed
B: 1 to 2 minor cracks were confirmed
C: Severe disconnection or peeling of the conductive coating film was confirmed
(Resistance Variation Rate During Thermal Stretching)
A: 5 times or more and less than 10 times
B: 10 times or more and less than 100 times
C: 100 times or more

[(7) Thermal Stretching Evaluation 4]

In the above thermal stretching evaluation 3, evaluation was made in the same manner as the above thermal stretching evaluation 3 according to the following criteria except that the elongation ratio was changed to 100%. The results are shown in Tables 2 and 3.
(Presence or Absence of Disconnection)
A: No disconnection was observed
B: 1 to 2 minor cracks were confirmed
C: Severe disconnection or peeling of the conductive coating film was confirmed
(Resistance Variation Rate During Thermal Stretching)
A: 10 times or more and less than 100 times
B: 100 times or more and less than 1000 times
C: 1000 times or more

[(8) Measurement of Breaking Elongation Rate of Embodiment 50]

On a peeling-treated PET film (manufactured by Lintec Corporation, CN100) base material, the conductive composition (E1) was printed by a screen printer (manufactured by Minoscreen, Minomat SR5575 semi-automatic screen printer) to obtain a dry film thickness of 10 μm, and then heated in a hot-air drying oven at 120° C. for 30 minutes, thereby forming a conductive layer of the solid conductive composition (E1). Next, the conductive layer was peeled from the peeling-treated PET film to obtain the conductive layer for measuring breaking elongation rate. A peeling-treated PET film base material was prepared separately, and the decorative ink (F1) was applied to the base material using a blade coater to obtain a dry film thickness of 2 μm, and heated at 120° C. for 30 minutes to form a decorative layer. Next, the decorative layer was peeled from the peeling-treated PET film to obtain the decorative layer for measuring breaking elongation rate. A polycarbonate film (manufactured by Teijin Ltd., Panlite 2151, thickness 300 μm) was prepared as a base film for measuring breaking elongation rate. The conductive layer, the decorative layer, and the base film for measuring breaking elongation rate were respectively cut out into a shape of 60 mm×10 mm, and the breaking elongation rate when each was stretched at a stretching speed of 10 mm/min was measured in a heating oven at 160° C. As a result, the respective breaking elongation rates were 400% for the base film, 300% for the decorative layer, and 140% for the conductive layer.

<Embodiments 51 to 53: Production of Molded Article>

A hemispherical ABS resin molded product with a radius of 3 cm was aligned to face the surface on the conductor side so as to overlap the position of the linear pattern of 3 mm×60 mm of the molded films of Embodiment 11, Embodiment 49, and Embodiment 50, and overlay molding was performed at a set temperature of 160° C. using a TOM molding machine (Fu-se Vacuum Forming Co., Ltd.), thereby obtaining a molded article in which the molded film molded into a hemispherical shape and the ABS resin molded product were integrated. As a result of confirming the disconnection of the linear pattern and the resistance variation rate during thermal stretching, no disconnection was confirmed and the variation of the resistance value was 10 times or more and less than 100 times, which confirmed that the circuit was a practical three-dimensional circuit.

<Embodiments 54 to 56>

A hemispherical metal mold with a radius of 3 cm was aligned to face the surface on the conductor side so as to overlap the position of the linear pattern of 3 mm×60 mm of the molded films obtained in Embodiment 33, Embodiment 49, and Embodiment 50, and overlay molding was performed at a set temperature of 160° C. using a TOM molding machine (Fu-se Vacuum Forming Co., Ltd.), thereby obtaining a hemispherically shaped molding film with a patterned conductor. Then, the hemispherically shaped molded film was set in an injection molding machine (manufactured by Toshiba Machine Co., Ltd., IS170 (i5)) equipped with a valve gate type in-mold molding test mold, and PC/ABS resin (manufactured by LG Chem, Ltd., LUPOYPC/ABSHI5002) was injection-molded to obtain a molded article integrated with the film for molding with a patterned conductor (injection conditions: screw diameter 40 mm, cylinder temperature 250° C., mold temperature (fixed side, movable side) 60° C., injection pressure 160 MPa (80%), holding pressure 100 MPa, injection speed 60 mm/second (28%), injection time 4 seconds, cooling time 20 seconds). As a result of confirming the disconnection of the linear pattern and the resistance variation rate during thermal stretching, no disconnection was confirmed and the variation of the resistance value was 10 times or more and less than 100 times, which confirmed that the circuit was a practical three-dimensional circuit.

TABLE 1

| Conductive composition for molded film | | Embodiment 17 E1 | Embodiment 18 E2 | Embodiment 19 E3 | Embodiment 20 E4 | Embodiment 21 E5 | Embodiment 22 E6 |
|---|---|---|---|---|---|---|---|
| Resin (A) | (A1) | 20.0 | 20.0 | | | | . |
| | (A2) | | | 20.0 | | | |
| | (A3) | | | | 20.0 | | |
| | (A4) | | | | | 20.0 | |
| Conductive fine particles (B) | (B1) | 80.0 | 60.0 | 80.0 | 80.0 | 80.0 | 80.0 |
| | (B2) | | | | | | |
| | (B3) | | | | | | |
| | (B4) | | | | | | |
| | (B5) | | | | | | |
| Solvent (C) | (C1) | 30.0 | | | | | |
| | (C2) | | 30.0 | | | | |
| | (C3) | | | 50.0 | | | |
| | (C4) | | | | 30.0 | | |
| | (C5) | | | | | 30.0 | |
| | (C6) | | | | | | 30.0 |
| | (C7) | | | | | | |
| | (C8) | | | | | | |
| | (C9) | | | | | | |
| | (C10) | | | | | | |
| | (C11) | | | | | | |
| | (C12) | | | | | | |
| | (C13) | | | | | | |
| | (C14) | | | | | | |
| | (C17) | | | | | | |
| Curing agent (D) | (D1) | | | | | | |
| | (D2) | | | | | | |
| Reactive functional group amount ratio $(F_D)/(M_A)$ | | 0 | 0 | 0 | 0 | 0 | 0 |
| Base film raw material | | PC | PC | PC | PC | PC | PC |
| With decorative printing layer? | | No | No | No | No | No | No |
| (1) Volume resistivity (Ω · cm) | | $8 \times 10^{-5}$ | $5 \times 10^{-4}$ | $2 \times 10^{-4}$ | $6 \times 10^{-5}$ | $9 \times 10^{-5}$ | $8 \times 10^{-5}$ |
| (2) Peeling adhesiveness | | A | A | A | A | A | B |
| (3) Wiring resistance (Ω) | | 1.5 | 12.3 | 5.1 | 1.1 | 1.7 | 1.5 |
| (4) Thermal stretching evaluation 1 | Disconnection occurred? | A | A | A | A | A | A |
| | Resistance variation rate during thermal stretching | A | A | A | A | A | B |
| (5) Thermal stretching evaluation 2 | Disconnection occurred? | A | A | B | A | A | B |
| | Resistance variation rate during thermal stretching | B | B | B | B | B | B |

| Conductive composition for molded film | | Embodiment 23 E7 | Embodiment 24 E8 | Embodiment 25 E9 | Embodiment 26 E10 | Embodiment 27 E11 | Embodiment 28 E12 |
|---|---|---|---|---|---|---|---|
| Resin (A) | (A1) | | 20.0 | 20.0 | 20.0 | 20.0 | |
| | (A2) | 20.0 | | | | | |
| | (A3) | | | | | | 20.0 |
| | (A4) | | | | | | |
| Conductive fine particles (B) | (B1) | 80.0 | | | | | 80.0 |
| | (B2) | | 150.0 | | | | |
| | (B3) | | | 180.0 | | | |
| | (B4) | | | | 70.0 | | |
| | (B5) | | | | | 30.0 | |
| Solvent (C) | (C1) | | | | | | |
| | (C2) | | | | | | |
| | (C3) | | | | | | |
| | (C4) | | | | | | |
| | (C5) | | | | | | |
| | (C6) | | | | | | |
| | (C7) | 50.0 | | | | | |
| | (C8) | | 30.0 | | | | |
| | (C9) | | | 30.0 | | | |
| | (C10) | | | | 30.0 | | |
| | (C11) | | | | | 30.0 | |
| | (C12) | | | | | | 30.0 |
| | (C13) | | | | | | |
| | (C14) | | | | | | |
| | (C17) | | | | | | |
| Curing agent (D) | (D1) | | | | | | |
| | (D2) | | | | | | |

TABLE 1-continued

| | | | | | | |
|---|---|---|---|---|---|---|
| Reactive functional group amount ratio $(F_D)/(M_A)$ | 0 | 0 | 0 | 0 | 0 | 0 |
| Base film raw material | PC | PC | PC | PC | PC | PC |
| With decorative printing layer? | No | No | No | No | No | No |
| (1) Volume resistivity ($\Omega \cdot$ cm) | $2 \times 10^{-4}$ | $5 \times 10^{-5}$ | $9 \times 10^{-5}$ | $6 \times 10^{-1}$ | $9 \times 10^{-2}$ | $9 \times 10^{-5}$ |
| (2) Peeling adhesiveness | B | A | A | A | A | A |
| (3) Wiring resistance ($\Omega$) | 5.4 | 0.9 | 1.7 | 11000 | 1700 | 1.6 |
| (4) Thermal stretching evaluation 1 — Disconnection occurred? | A | A | A | A | A | A |
| Resistance variation rate during thermal stretching | B | A | A | A | A | A |
| (5) Thermal stretching evaluation 2 — Disconnection occurred? | B | A | A | A | A | B |

| Conductive composition for molded film | | Embodiment 29 E13 | Embodiment 30 E14 | Embodiment 31 E15 | Embodiment 32 E16 |
|---|---|---|---|---|---|
| Resin (A) | (A1) | | 20.0 | | 20.0 |
| | (A2) | | | | |
| | (A3) | | | | |
| | (A4) | 20.0 | | 20.0 | |
| Conductive fine particles (B) | (B1) | | 80.0 | 80.0 | 80.0 |
| | (B2) | 180.0 | | | |
| | (B3) | | | | |
| | (B4) | | | | |
| | (B5) | | | | |
| Solvent (C) | (C1) | | 15.0 | | |
| | (C2) | | | | 30.0 |
| | (C3) | | | | |
| | (C4) | | | | |
| | (C5) | 30.0 | | 30.0 | |
| | (C6) | | | | |
| | (C7) | | | | |
| | (C8) | | | | |
| | (C9) | | | | |
| | (C10) | | | | |
| | (C11) | | | | |
| | (C12) | | | | |
| | (C13) | 30.0 | | | |
| | (C14) | | 15.0 | | |
| | (C17) | | | 1.3 | |
| Curing agent (D) | (D1) | | | 3.1 | |
| | (D2) | | | | 0.2 |
| Reactive functional group amount ratio $(F_D)/(M_A)$ | | 0 | 0 | $5.3 \times 10^{-4}$ | $7.1 \times 10^{-5}$ |
| Base film raw material | | PC | PC | PC | PC |
| With decorative printing layer? | | No | No | No | No |
| (1) Volume resistivity ($\Omega \cdot$ cm) | | $4 \times 10^{-5}$ | $9 \times 10^{-5}$ | $1 \times 10^{-4}$ | $9 \times 10^{-5}$ |
| (2) Peeling adhesiveness | | A | A | A | A |
| (3) Wiring resistance ($\Omega$) | | 0.7 | 1.5 | 2.2 | 1.7 |
| (4) Thermal stretching evaluation 1 — Disconnection occurred? | | A | A | A | A |
| Resistance variation rate during thermal stretching | | A | A | A | A |
| (5) Thermal stretching evaluation 2 — Disconnection occurred? | | A | A | A | A |
| Resistance variation rate during thermal stretching | | B | B | A | A |

| Conductive composition for molded film | | Embodiment 33 E1 | Embodiment 34 E2 | Embodiment 35 E3 | Embodiment 36 E4 | Embodiment 37 E5 | Embodiment 38 E6 |
|---|---|---|---|---|---|---|---|
| Resin (A) | (A1) | 20.0 | 20.0 | | | | 20.0 |
| | (A2) | | | 20.0 | | | |
| | (A3) | | | | 20.0 | | |
| | (A4) | | | | | 20.0 | |
| Conductive fine particles (B) | (B1) | 80.0 | 60.0 | 80.0 | 80.0 | 80.0 | 80.0 |
| | (B2) | | | | | | |
| | (B3) | | | | | | |
| | (B4) | | | | | | |
| | (B5) | | | | | | |
| Solvent (C) | (C1) | 30.0 | | | | | |
| | (C2) | | 30.0 | | | | |
| | (C3) | | | 50.0 | | | |
| | (C4) | | | | 30.0 | | |
| | (C5) | | | | | 30.0 | |
| | (C6) | | | | | | 30.0 |
| | (C7) | | | | | | |
| | (C8) | | | | | | |

-continued

| | | | | | | | |
|---|---|---|---|---|---|---|---|
| | (C9) | | | | | | |
| | (C10) | | | | | | |
| | (C11) | | | | | | |
| | (C12) | | | | | | |
| | (C13) | | | | | | |
| | (C14) | | | | | | |
| | (C17) | | | | | | |
| Curing agent (D) | (D1) | | | | | | |
| | (D2) | | | | | | |
| Reactive functional group amount ratio $(F_D)/(M_A)$ | | 0 | 0 | 0 | 0 | 0 | 0 |
| Base film raw material | | acrylic | acrylic | acrylic | acrylic | acrylic | acrylic |
| With decorative printing layer? | | No | No | No | No | No | No |
| (1) Volume resistivity ($\Omega \cdot cm$) | | $8 \times 10^{-5}$ | $5 \times 10^{-4}$ | $2 \times 10^{-4}$ | $6 \times 10^{-5}$ | $9 \times 10^{-5}$ | $8 \times 10^{-5}$ |
| (2) Peeling adhesiveness | | A | A | A | A | A | B |
| (3) Wiring resistance ($\Omega$) | | 1.5 | 12.3 | 5.1 | 1.1 | 1.7 | 1.5 |
| (4) Thermal stretching evaluation 1 or (6) thermal stretching evaluation 3 | Disconnection occurred? | A | A | A | A | A | A |
| | Resistance variation rate during thermal stretching | A | A | A | A | A | B |
| (5) Thermal stretching evaluation 2 or (7) thermal stretching evaluation 4 | Disconnection occurred? | A | A | B | A | A | B |
| | Resistance variation rate during thermal stretching | B | B | B | B | B | B |

| | | Embodiment 39 | Embodiment 40 | Embodiment 41 | Embodiment 42 | Embodiment 43 | Embodiment 44 |
|---|---|---|---|---|---|---|---|
| Conductive composition for molded film | | E7 | E8 | E9 | E10 | E11 | E12 |
| Resin (A) | (A1) | | 20.0 | 20.0 | 20.0 | 20.0 | |
| | (A2) | 20.0 | | | | | |
| | (A3) | | | | | | |
| | (A4) | | | | | | 20.0 |
| Conductive fine particles (B) | (B1) | 80.0 | | | | | 80.0 |
| | (B2) | | 150.0 | | | | |
| | (B3) | | | 180.0 | | | |
| | (B4) | | | | 70.0 | | |
| | (B5) | | | | | 30.0 | |
| Solvent (C) | (C1) | | | | | | |
| | (C2) | | | | | | |
| | (C3) | | | | | | |
| | (C4) | | | | | | |
| | (C5) | | | | | | |
| | (C6) | | | | | | |
| | (C7) | 50.0 | | | | | |
| | (C8) | | 30.0 | | | | |
| | (C9) | | | 30.0 | | | |
| | (C10) | | | | 30.0 | | |
| | (C11) | | | | | 30.0 | |
| | (C12) | | | | | | 30.0 |
| | (C13) | | | | | | |
| | (C14) | | | | | | |
| | (C17) | | | | | | |
| Curing agent (D) | (D1) | | | | | | |
| | (D2) | | | | | | |
| Reactive functional group amount ratio $(F_D)/(M_A)$ | | 0 | 0 | 0 | 0 | 0 | 0 |
| Base film raw material | | acrylic | acrylic | acrylic | acrylic | acrylic | acrylic |
| With decorative printing layer? | | No | No | No | No | No | No |
| (1) Volume resistivity ($\Omega \cdot cm$) | | $2 \times 10^{-4}$ | $5 \times 10^{-5}$ | $9 \times 10^{-5}$ | $6 \times 10^{-1}$ | $9 \times 10^{-2}$ | $9 \times 10^{-5}$ |
| (2) Peeling adhesiveness | | B | A | A | A | A | A |
| (3) Wiring resistance ($\Omega$) | | 5.4 | 0.9 | 1.7 | 11000 | 1700 | 1.6 |
| (4) Thermal stretching evaluation 1 or (6) thermal stretching evaluation 3 | Disconnection occurred? | A | A | A | A | A | A |
| | Resistance variation rate during thermal stretching | B | A | A | A | A | A |
| (5) Thermal stretching evaluation 2 or (7) thermal stretching evaluation 4 | Disconnection occurred? | B | A | A | A | A | A |
| | Resistance variation rate during thermal stretching | C | B | B | B | B | B |

| | | Embodiment 45 | Embodiment 46 | Embodiment 47 | Embodiment 48 | Embodiment 49 | Embodiment 50 |
|---|---|---|---|---|---|---|---|
| Conductive composition for molded film | | E13 | E14 | E15 | E16 | E1 | E1 |
| Resin (A) | (A1) | | 20.0 | | 20.0 | 20.0 | 20.0 |
| | (A2) | | | | | | |
| | (A3) | | | | | | |
| | (A4) | 20.0 | | 20.0 | | | |

-continued

|  |  |  |  |  |  |  |  |
|---|---|---|---|---|---|---|---|
| Conductive fine particles (B) | (B1) |  | 80.0 | 80.0 | 80.0 | 80.0 | 80.0 |
|  | (B2) | 180.0 |  |  |  |  |  |
|  | (B3) |  |  |  |  |  |  |
|  | (B4) |  |  |  |  |  |  |
|  | (B5) |  |  |  |  |  |  |
| Solvent (C) | (C1) |  | 15.0 |  |  | 30.0 | 30.0 |
|  | (C2) |  |  |  | 30.0 |  |  |
|  | (C3) |  |  |  |  |  |  |
|  | (C4) |  |  |  |  |  |  |
|  | (C5) | 30.0 |  | 30.0 |  |  |  |
|  | (C6) |  |  |  |  |  |  |
|  | (C7) |  |  |  |  |  |  |
|  | (C8) |  |  |  |  |  |  |
|  | (C9) |  |  |  |  |  |  |
|  | (C10) |  |  |  |  |  |  |
|  | (C11) |  |  |  |  |  |  |
|  | (C12) |  |  |  |  |  |  |
|  | (C13) | 30.0 |  |  |  |  |  |
|  | (C14) |  | 15.0 |  |  |  |  |
|  | (C17) |  |  | 1.3 |  |  |  |
| Curing agent (D) | (D1) |  |  | 3.1 |  |  |  |
|  | (D2) |  |  |  | 0.2 |  |  |
| Reactive functional group amount ratio ($F_D$)/($M_A$) |  | 0 | 0 | $5.3 \times 10^{-4}$ | $7.1 \times 10^{-5}$ | 0 | 0 |
| Base film raw material |  | acrylic | acrylic | acrylic | acrylic | PC/acrylic | PC |
| With decorative printing layer? |  | No | No | No | No | No | Yes |
| (1) Volume resistivity ($\Omega \cdot$ cm) |  | $4 \times 10^{-5}$ | $9 \times 10^{-5}$ | $1 \times 10^{-4}$ | $9 \times 10^{-5}$ | $9 \times 10^{-5}$ | $9 \times 10^{-5}$ |
| (2) Peeling adhesiveness |  | A | A | A | A | A | A |
| (3) Wiring resistance ($\Omega$) |  | 0.7 | 1.5 | 2.2 | 1.7 | 2.3 | 2.3 |
| (4) Thermal stretching evaluation 1 or (6) thermal stretching evaluation 3 | Disconnection occurred? | A | A | A | A | A | A |
|  | Resistance variation rate during thermal stretching | A | A | A | A | A | A |
| (5) Thermal stretching evaluation 2 or (7) thermal stretching evaluation 4 | Disconnection occurred? | A | A | A | A | A | A |
|  | Resistance variation rate during thermal stretching | B | B | A | A | B | B |

*In Table 2, the results of (6) thermal stretching evaluation 3 and (7) thermal stretching evaluation 4 are shown in Embodiments 33-48. Further, the results of (4) thermal stretching evaluation 1 and (5) thermal stretching evaluation 2 are shown in Embodiments 49 and 50.

TABLE 3

|  |  | Comparative example 4 | Comparative example 5 | Comparative example 6 |
|---|---|---|---|---|
| Conductive composition for molded film |  | E17 | E18 | E19 |
| Resin (A) | (A1) | 20 | 20 | 20 |
|  | (A2) |  |  |  |
|  | (A3) |  |  |  |
|  | (A4) |  |  |  |
| Conductive fine particles (B) | (B1) | 80.0 | 80.0 | 80.0 |
|  | (B2) |  |  |  |
|  | (B3) |  |  |  |
|  | (B4) |  |  |  |
|  | (B5) |  |  |  |
| Solvent (C) | (C14) | 30.0 |  |  |
|  | (C15) |  | 30.0 |  |
|  | (C16) |  |  | 30.0 |
| Reactive functional group amount ratio ($F_D$)/($M_A$) |  | 0 | 0 | 0 |
| Base film raw material |  | PC | PC | PC |
| With decorative printing layer? |  | No | No | No |
| (1) Volume resistivity ($\Omega \cdot$cm) |  | $1 \times 10^{-4}$ | $9 \times 10^{-5}$ | $1 \times 10^{-4}$ |
| (2) Peeling adhesiveness |  | C | C | C |
| (3) Wiring resistance ($\Omega$) |  | 1.8 | 1.5 | 1.8 |
| (4) Thermal stretching evaluation 1 (Comparative Examples 4-6) (6) Thermal stretching evaluation 3 (Comparative Examples 7-9) | Disconnection occurred? | B | C | C |
|  | Resistance variation rate during thermal stretching | C | C | C |

TABLE 3-continued

| | | | | | |
|---|---|---|---|---|---|
| (5) Thermal stretching evaluation 2 (Comparative Examples 4-6) (7) Thermal stretching evaluation 4 (Comparative Examples 7-9) | Disconnection occurred? Resistance variation rate during thermal stretching | C C | C C | C C | |

| | | Comparative example 7 | Comparative example 8 | Comparative example 9 |
|---|---|---|---|---|
| Conductive composition for molded film | | E17 | E18 | E19 |
| Resin (A) | (A1) | 20 | 20 | 20 |
| | (A2) | | | |
| | (A3) | | | |
| | (A4) | | | |
| Conductive fine particles (B) | (B1) | 80.0 | 80.0 | 80.0 |
| | (B2) | | | |
| | (B3) | | | |
| | (B4) | | | |
| | (B5) | | | |
| Solvent (C) | (C14) | 30.0 | | |
| | (C15) | | 30.0 | |
| | (C16) | | | 30.0 |
| Reactive functional group amount ratio $(F_D)/(M_A)$ | | 0 | 0 | 0 |
| Base film raw material | | acrylic | acrylic | acrylic |
| With decorative printing layer? | | No | No | No |
| (1) Volume resistivity (Ω·cm) | | $1 \times 10^{-4}$ | $9 \times 10^{-5}$ | $1 \times 10^{-4}$ |
| (2) Peeling adhesiveness | | C | C | C |
| (3) Wiring resistance (Ω) | | 1.8 | 1.5 | 1.8 |
| (4) Thermal stretching evaluation 1 (Comparative Examples 4-6) (6) Thermal stretching evaluation 3 (Comparative Examples 7-9) | Disconnection occurred? Resistance variation rate during thermal stretching | B C | C C | C C |
| (5) Thermal stretching evaluation 2 (Comparative Examples 4-6) (7) Thermal stretching evaluation 4 (Comparative Examples 7-9) | Disconnection occurred? Resistance variation rate during thermal stretching | C C | C C | C C |

Summary of Results

Regarding the conductive layers formed using the conductive compositions of Comparative Examples 1 to 3 that used a high boiling point solvent having a polar parameter δp of the Hansen solubility parameter (HSP) exceeding 5.0 and a hydrogen-bond parameter δh of the Hansen solubility parameter less than 9.8, it was clear that the conductive layers were fractured during thermal stretching and the resistance value increased.

On the other hand, regarding the conductive composition of the present embodiment, from the results of Embodiments 17 to 50, the adhesiveness of the obtained conductive layer and the stretching of the conductive layer during molding did not cause disconnection or peeling, and the resistance value was kept good. The reason is presumed to be that, as the solvent used for the conductive composition of the present embodiment had a high boiling point and was in a specific HSP range, it was possible to slow down volatilization and maintain good printability, and furthermore, solvent permeation during high temperature contact with the base film was suppressed to the minimum, and the good base material adhesiveness and the original cohesive force, conductivity and stretching suitability of the conductor were exhibited.

In addition, from the results of Embodiments 51 to 56, with the molded film including the conductive layer of the conductive composition of the invention, an excellent wiring-integrated molded article was obtained even if the base material surface had an uneven three-dimensional shape.

As described above, the molded film and the wiring-integrated molded article using the conductive composition of the present embodiment make it possible to directly build lightweight and space-saving circuits in plastic housings and three-dimensional parts, such as home appliances, automobile components, robots, and drones, without sacrificing design flexibility, to manufacture touch sensors, antennas, planar heating elements, electromagnetic wave shields, inductors (coils), and resistors, and to mount various electronic components. In addition, it is extremely useful for making electronic devices lighter, thinner, shorter, smaller, more flexible in design, and more multifunctional.

This application claims priority on the basis of Japanese Patent Application No. 2018-80514 filed on Apr. 19, 2018, and incorporates herein all the disclosure thereof.

What is claimed is:

1. A conductive composition for molded film, comprising: a resin (A), conductive fine particles (B), a solvent (C), and a crosslinking agent (D),
   wherein a weight average molecular weight of the resin (A) is 20,000 or more and 600,000 or less,
   a content ratio of the resin (A) is 8% by mass or more and 40% by mass or less, based on a total solid content contained in the conductive composition,
   wherein the resin (A) comprises two or more of one or more types of reactive functional groups selected from a hydroxy group, an amino group, a carboxyl group, and an acid anhydride group in a molecule,
   wherein a shape of the conductive fine particles (B) is flake shape, wherein the solvent (C) comprises, in 100 parts by mass of the solvent (C), 40 parts by mass or more of a solvent (C') is at least one selected from the group consisting of diethylene glycol monomethyl ether, diethylene glycol monoethyl ether, diethylene glycol monobutyl ether, diethylene glycol dibutyl ether, triethylene glycol monomethyl ether, triethylene glycol dimethyl ether, benzyl alcohol, tetralin, terpineol, triacetin, propylene glycol, 1,3-butylene glycol, 1,4-butylene glycol, dipropylene glycol monopropyl ether, diethylene glycol monopropyl ether, dipropylene glycol monomethyl ether, tripropylene and glycol monomethyl ether, wherein the crosslinking agent (D) has two or more reactive functional groups capable of forming a crosslink with the reactive functional group of the resin (A) in one molecule, wherein a ratio between a total amount $F_D$ (mol) of a substance amount of a second reactive functional group of the crosslinking agent (D) and a mass $M_A$ (g) of the resin (A) satisfies the following formula (1):

$$5.0\times10^{-5}\leq F_D/M_A \leq 6.0\times10^{-4}. \qquad \text{formula (1)}$$

2. The conductive composition for molded film according to claim 1, wherein the conductive fine particles (B) comprise one or more types of conductive fine particles selected from silver powder, copper powder, silver-coated powder, copper alloy powder, conductive oxide powder, and carbon fine particles.

3. A molded film, comprising a conductive layer on a base film, wherein the conductive layer is a cured product of the conductive composition for molded film according to claim 1.

4. The molded film according to claim 3, wherein a relationship between breaking elongation rates of respective layers at a softening point temperature of the base film satisfies:

breaking elongation rate of the base film>breaking elongation rate of the conductive layer.

5. The molded film according to claim 3, wherein the base film is a film selected from polycarbonate, polymethylmethacrylate, and polyethylene terephthalate, or a laminated film of polycarbonate, polymethylmethacrylate, and polyethylene terephthalate.

6. A molded film, comprising a decorative layer and a conductive layer on a base film, wherein the conductive layer is a cured product of the conductive composition for molded film according to claim 1.

7. The molded film according to claim 6, wherein a relationship between breaking elongation rates of respective layers at a softening point temperature of the base film satisfies:

breaking elongation rate of the base film>breaking elongation rate of the decorative layer>breaking elongation rate of the conductive layer.

8. The molded film according to claim 6, wherein the base film is a film selected from polycarbonate, polymethylmethacrylate, and polyethylene terephthalate, or a laminated film of polycarbonate, polymethylmethacrylate, and polyethylene terephthalate.

9. A molded article in which a conductive layer is laminated on a base material, wherein the conductive layer is a cured product of the conductive composition for molded film according to claim 1.

10. A production method of a molded article, comprising:
producing a molded film by printing and drying the conductive composition for molded film according to claim 1 on a base film;
arranging the molded film on a base material; and
integrating the molded film and the base material by an overlay molding method.

11. A production method of a molded article, comprising:
producing a molded film by printing and drying the conductive composition for molded film according to claim 1 on a base film;
molding the molded film into a predetermined shape;
arranging the molded film that has been molded in a mold for injection molding; and
molding a base material by injection molding, and integrating the molded film and the base material.

12. A production method of a molded article, comprising:
producing a molded film by printing and drying the conductive composition for molded film according to claim 1 on a base film;
arranging the molded film in a mold for injection molding; and
molding a base material by injection molding, and transferring a conductive layer in the molded film to a base material side.

\* \* \* \* \*